(12) United States Patent
Min et al.

(10) Patent No.: US 11,787,157 B2
(45) Date of Patent: Oct. 17, 2023

(54) HIGH HEAT DISSIPATING THIN FILM AND METHOD FOR MANUFACTURING SAME

(71) Applicant: SOLUETA, Ansan-si (KR)

(72) Inventors: Eui Hong Min, Seongnam-si (KR); Sang Ho Cho, Hwaseong-si (KR); Buck Keun Choi, Hwaseong-si (KR)

(73) Assignee: SOLUETA, Ansan-si (KR)

( * ) Notice: Subject to any disclaimer, the term of this patent is extended or adjusted under 35 U.S.C. 154(b) by 175 days.

(21) Appl. No.: 16/729,874

(22) Filed: Dec. 30, 2019

(65) Prior Publication Data

US 2020/0147929 A1    May 14, 2020

Related U.S. Application Data

(63) Continuation of application No. PCT/KR2018/002591, filed on Mar. 5, 2018.

(30) Foreign Application Priority Data

Jun. 30, 2017  (KR) .................. 10-2017-0083745
May 13, 2019  (KR) .................. 10-2019-0055607

(51) Int. Cl.
| | | |
|---|---|---|
| B32B 9/00 | (2006.01) | |
| B32B 15/04 | (2006.01) | |
| B32B 7/12 | (2006.01) | |
| B32B 15/20 | (2006.01) | |
| C23C 14/06 | (2006.01) | |
| C23C 14/48 | (2006.01) | |

(Continued)

(52) U.S. Cl.
CPC .............. *B32B 15/043* (2013.01); *B32B 7/12* (2013.01); *B32B 15/20* (2013.01); *C23C 14/0605* (2013.01); *C23C 14/48* (2013.01); *B32B 2255/06* (2013.01); *B32B 2255/20* (2013.01); *B82Y 30/00* (2013.01); *H05K 7/2039* (2013.01); *Y10T 428/30* (2015.01)

(58) Field of Classification Search
CPC ....... B32B 9/007; Y10T 428/30; B82Y 30/00; C01B 31/04
USPC ........................................ 428/408; 423/448
See application file for complete search history.

(56) References Cited

U.S. PATENT DOCUMENTS

| | | | | |
|---|---|---|---|---|
| 6,131,651 | A * | 10/2000 | Richey, III ............. | F28F 13/00 165/185 |
| 2011/0189406 | A1 | 8/2011 | Cho et al. | |
| 2013/0187097 | A1* | 7/2013 | Hong ..................... | B82Y 40/00 252/502 |

(Continued)

FOREIGN PATENT DOCUMENTS

| | | |
|---|---|---|
| JP | 10330177 | 12/1998 |
| KR | 1020110016287 | 2/2011 |

(Continued)

OTHER PUBLICATIONS

Written Opinion of the International Searching Authority dated Jun. 11, 2018 for International Patent Application No. PCT/KR2018/002591, 8 pages (English Translation).

(Continued)

*Primary Examiner* — Daniel H Miller
(74) *Attorney, Agent, or Firm* — FINCH & MALONEY PLLC

(57) ABSTRACT

Provided is a high heat radiation thin film. The high heat radiation thin film may comprise a metal substrate, and a carbon layer which is disposed on the metal substrate and is thicker than 2.5 nm and thinner than 10 nm.

14 Claims, 12 Drawing Sheets

(51) Int. Cl.
  *H05K 7/20* (2006.01)
  *B82Y 30/00* (2011.01)

(56) References Cited

U.S. PATENT DOCUMENTS

| | | | | |
|---|---|---|---|---|
| 2013/0260150 A1* | 10/2013 | Grivei | ................... | C01B 32/225 252/502 |
| 2014/0170483 A1* | 6/2014 | Zhang | ................... | H01M 4/366 429/211 |
| 2015/0253089 A1* | 9/2015 | Fan | ..................... | H01L 23/3736 165/185 |
| 2015/0311137 A1* | 10/2015 | Oganesian | .......... | H01L 23/3677 257/712 |

FOREIGN PATENT DOCUMENTS

| | | |
|---|---|---|
| KR | 1020150046952 | 5/2015 |
| KR | 1020170031080 | 3/2017 |

OTHER PUBLICATIONS

Dékány et al., "Selective liquid sorption properties of hydrophobized graphite oxide nanostructures", Colloid Polym. Sci., 276, 570-576 (doi:10.1007/s003960050283) (1998).

Tsirka et al., "Mapping of Graphene Oxide and Single Layer Graphene Flakes—Defects Annealing and Healing", Front. Mater. 5:37 (doi:10.3389/fmats.2018.00037) (2018).

* cited by examiner

[Fig.1]
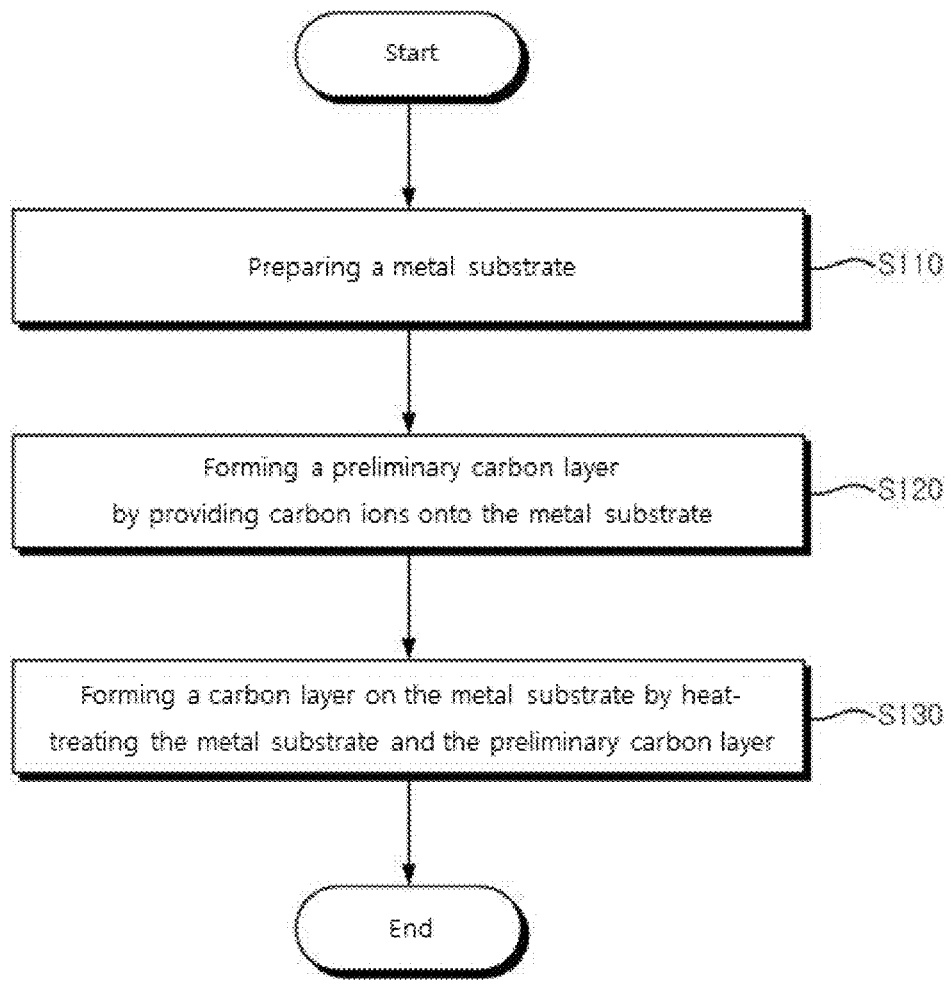
[Fig.2]
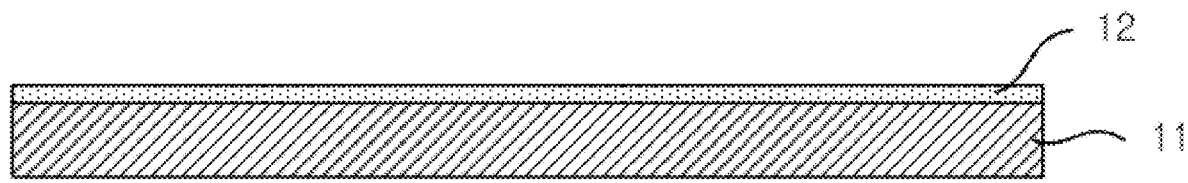

[Fig.3]
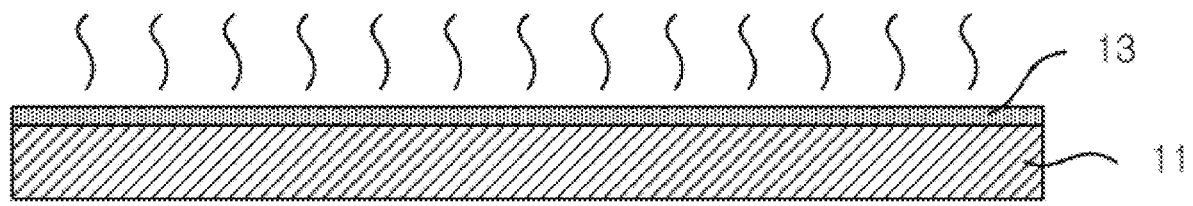
[Fig.4]
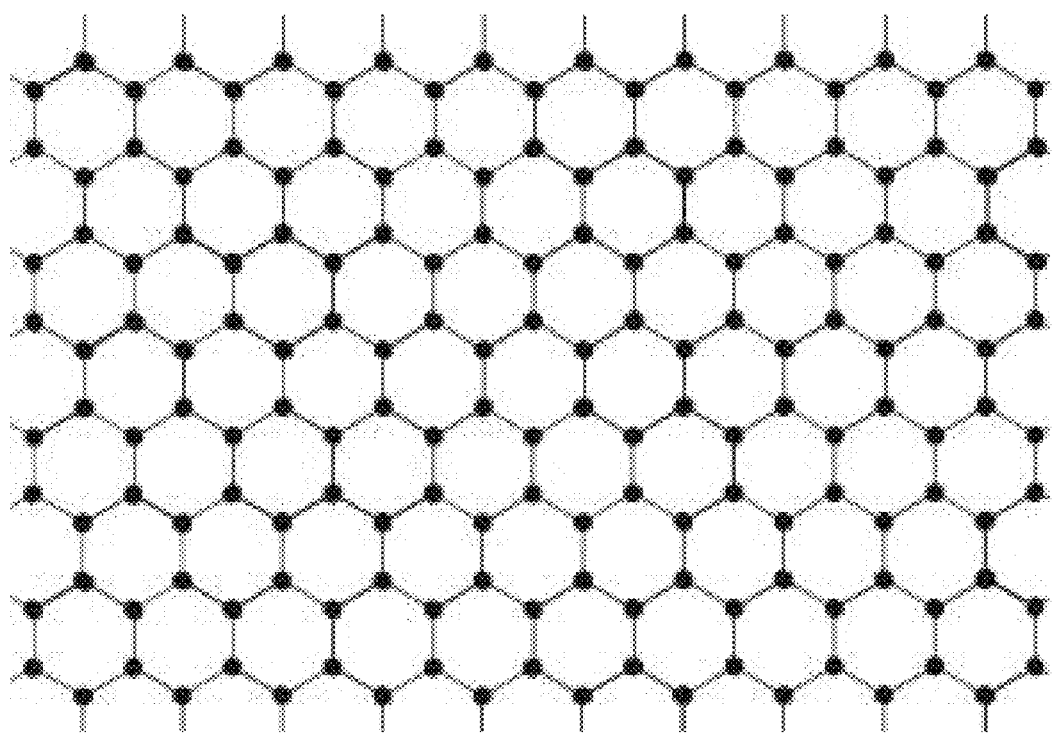

[Fig.5]
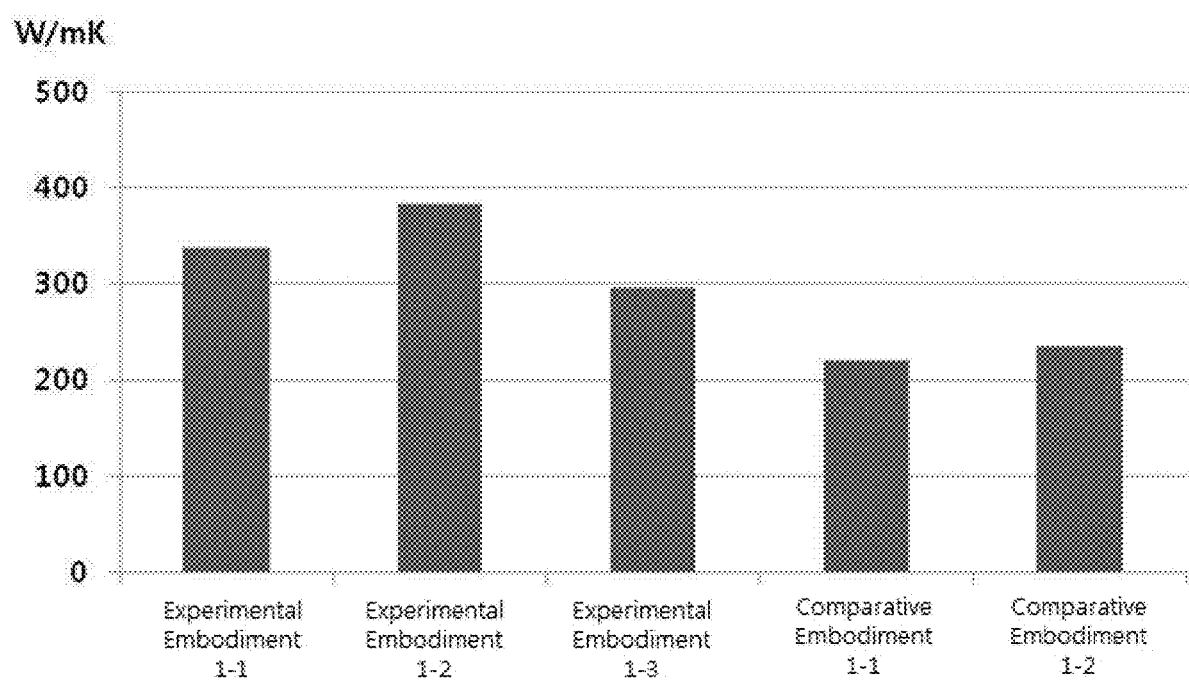

[Fig.6]
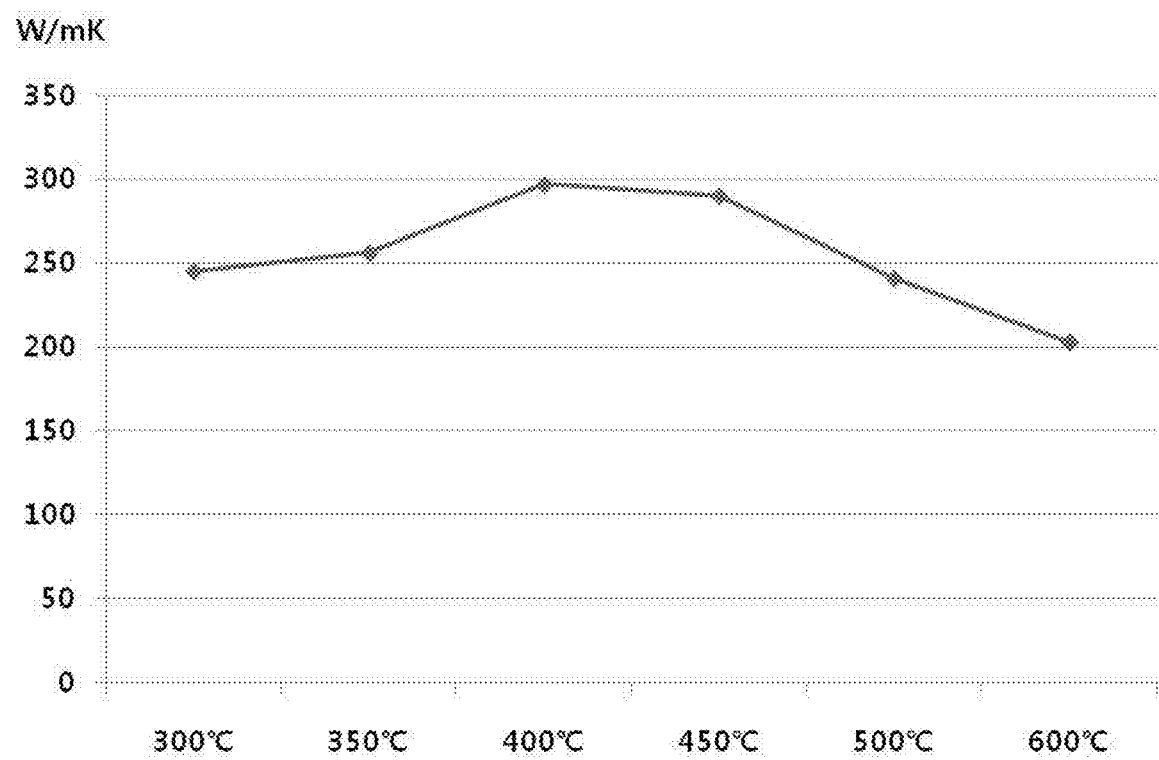

[Fig.7]
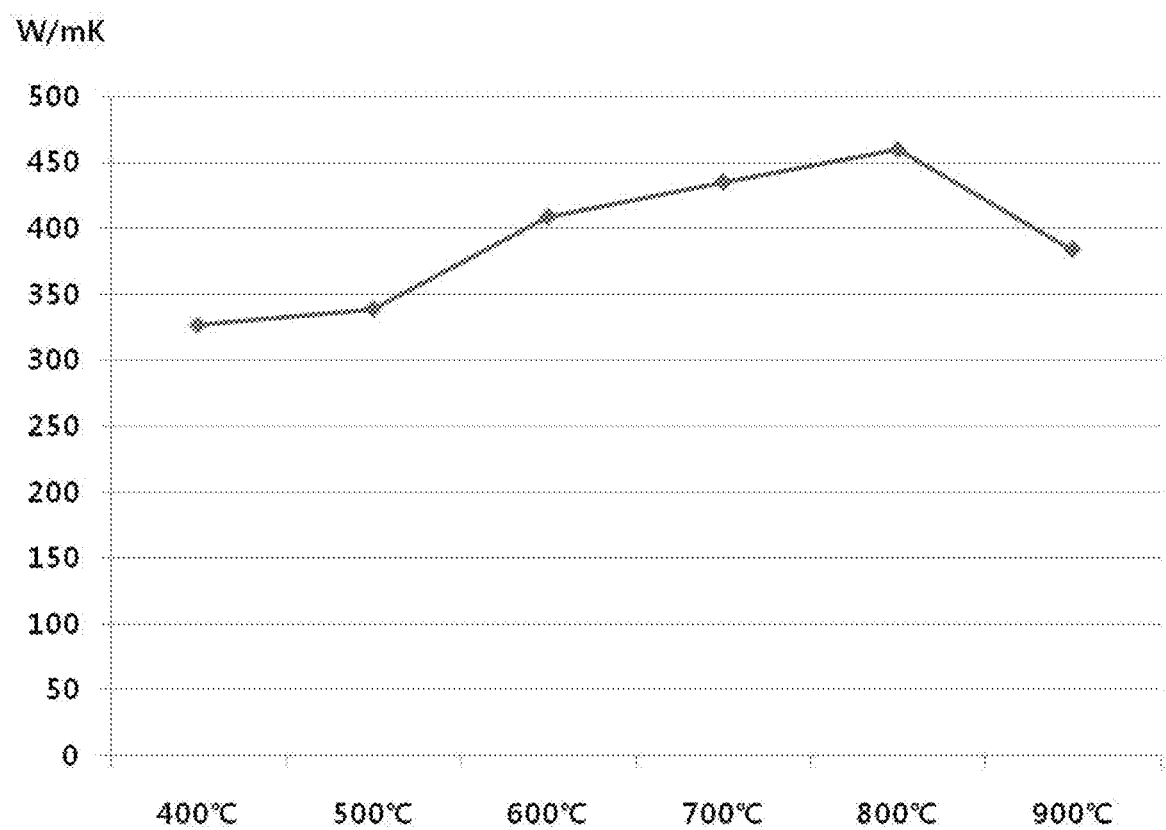

[Fig.8]
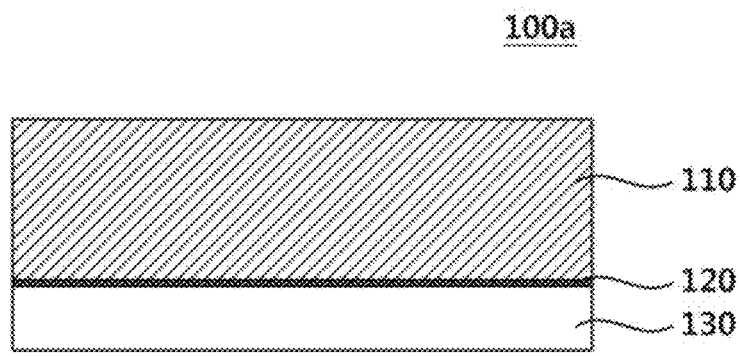
[Fig.9]
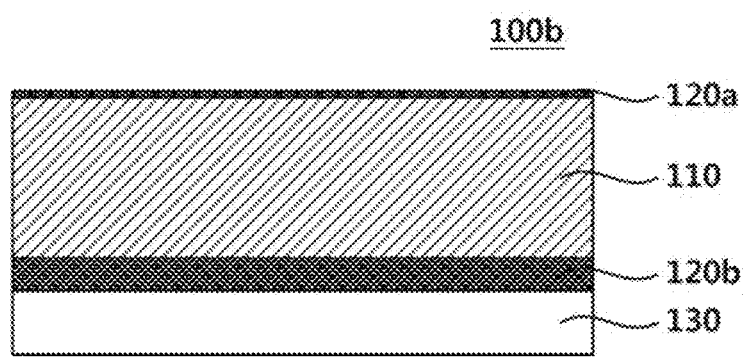
[Fig.10]
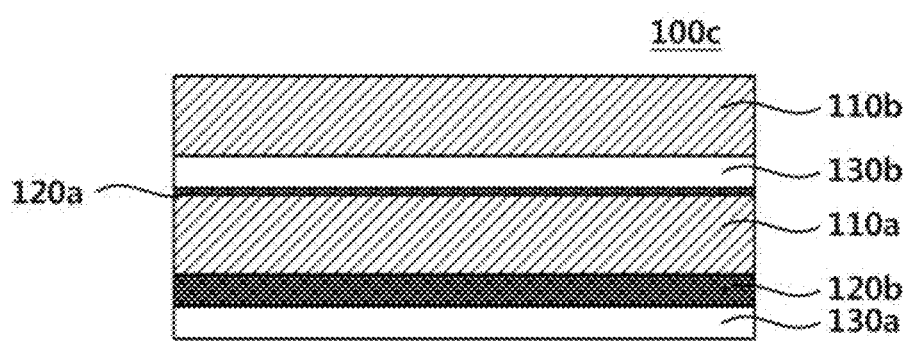

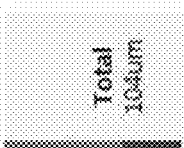
[Fig.11]

[Fig.12]
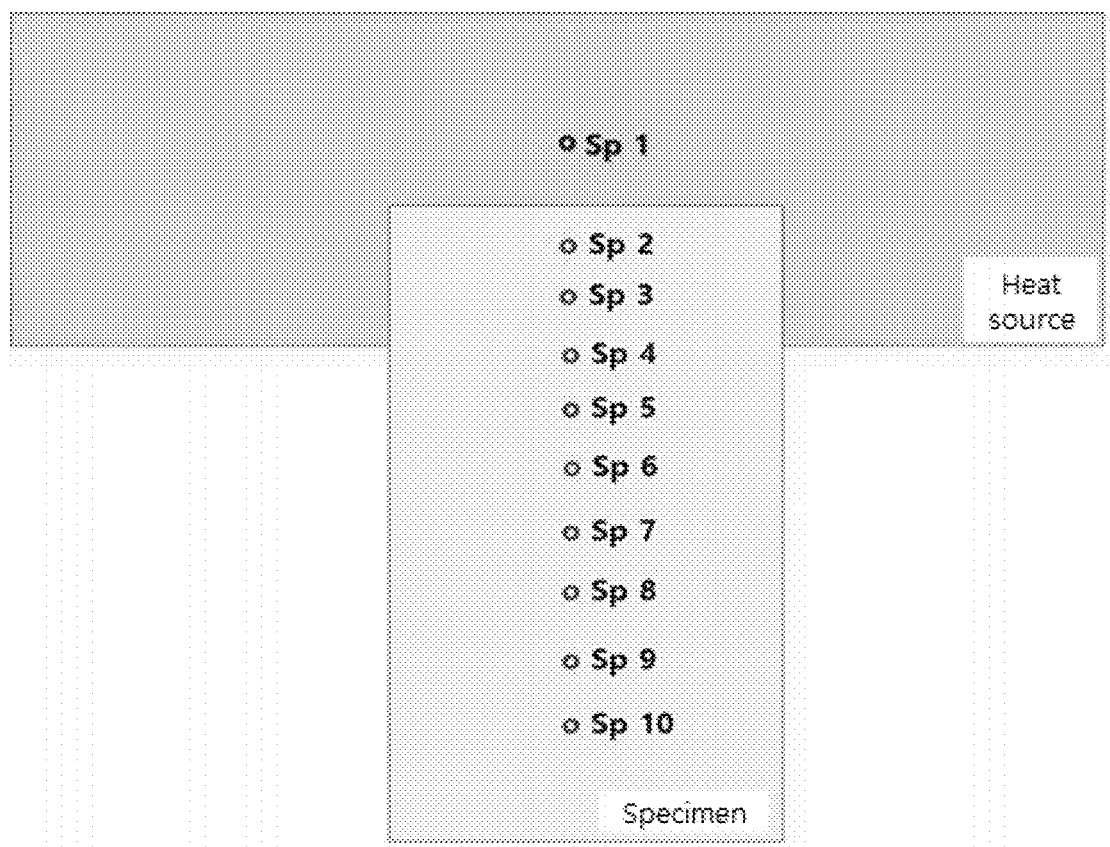

[Fig.13]
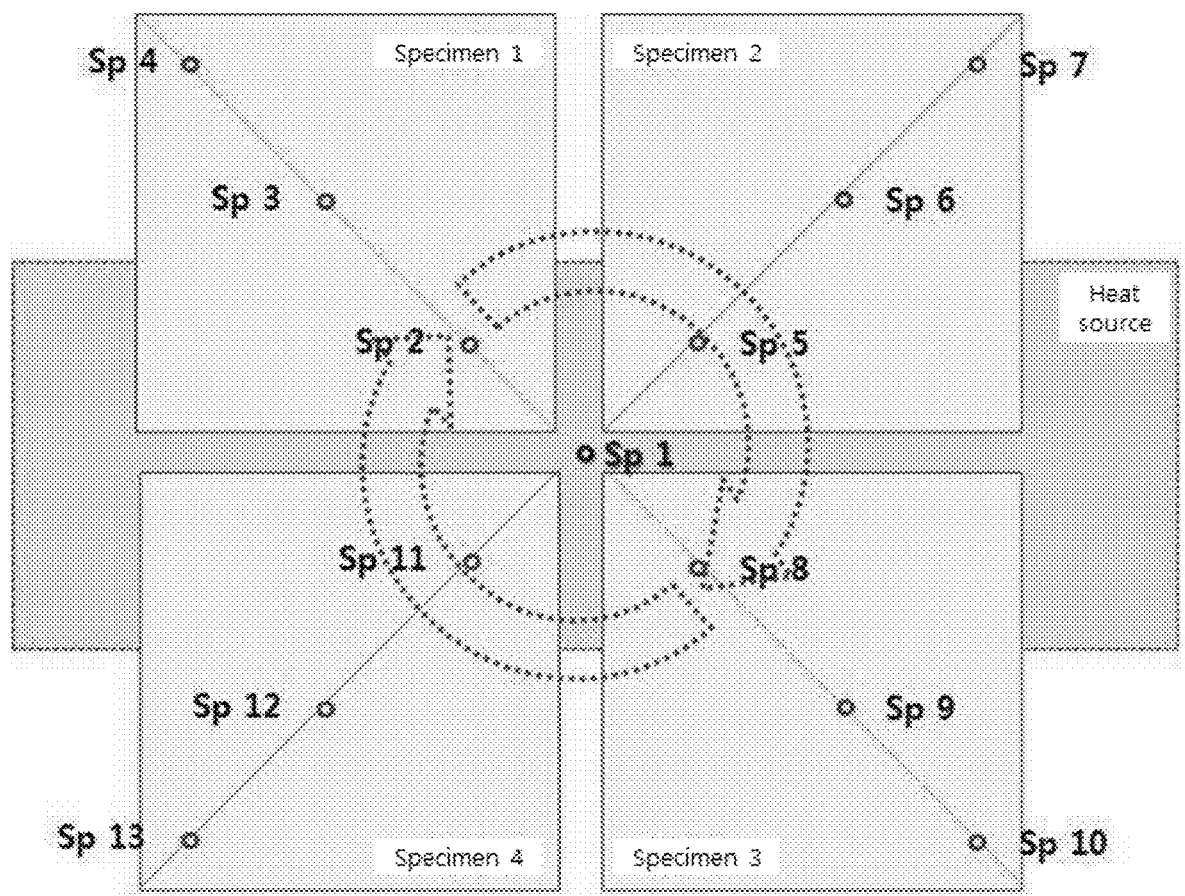

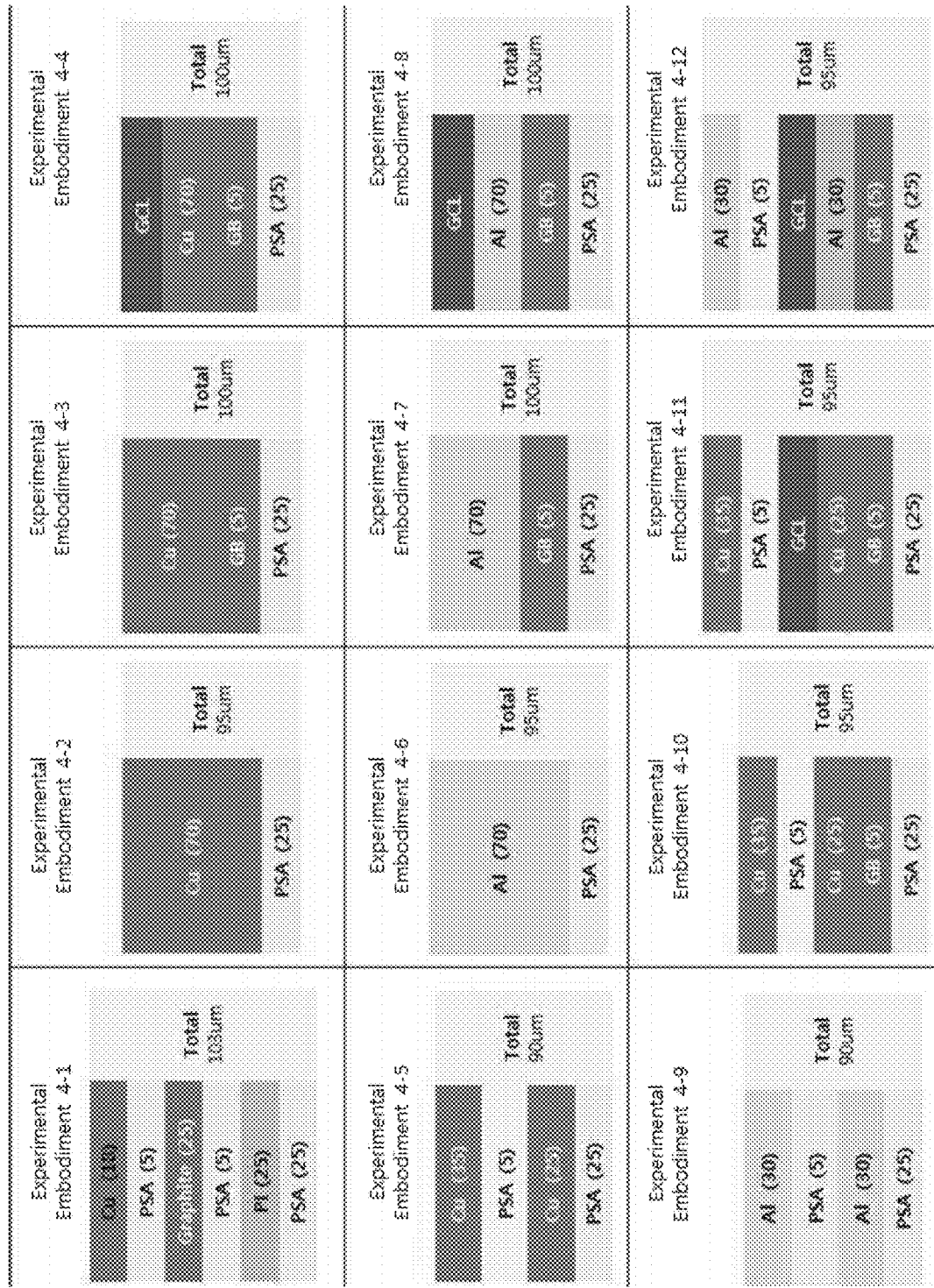
[Fig.14]

[Fig.15]
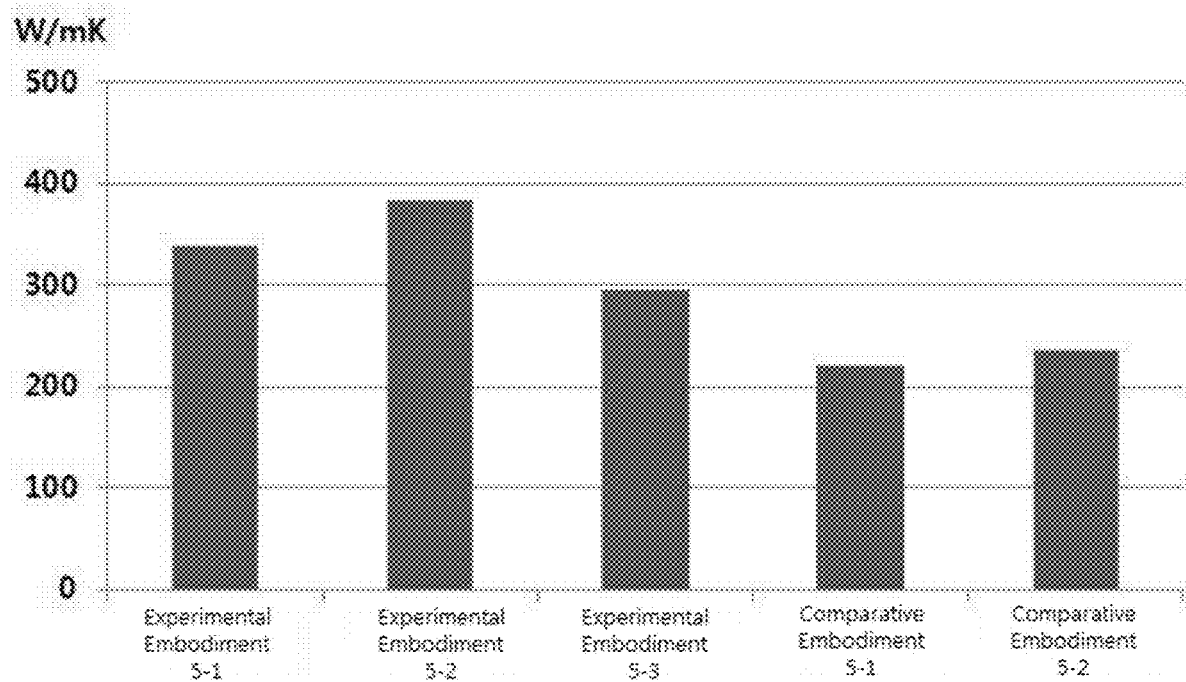
[Fig.16]
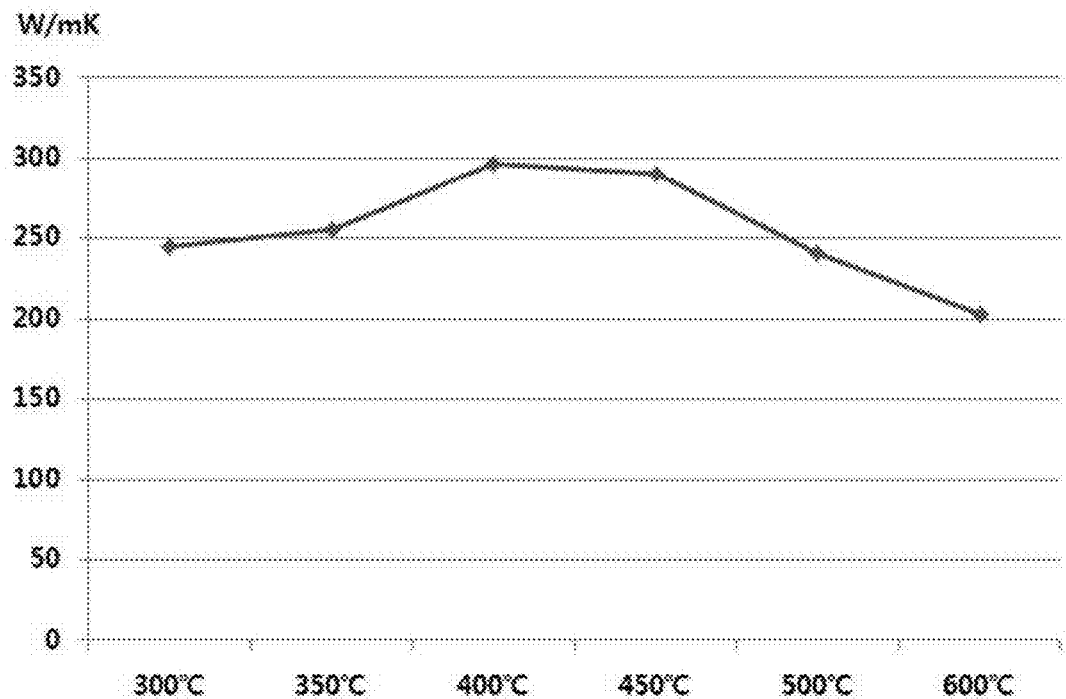

[Fig.17]
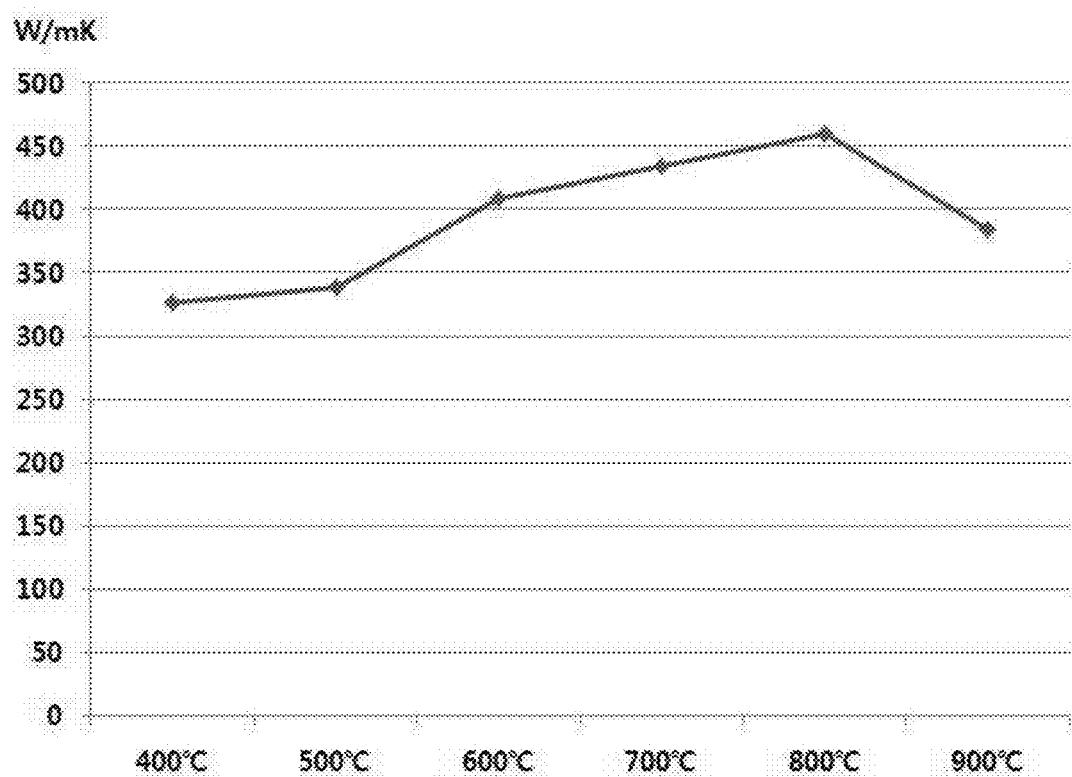

HIGH HEAT DISSIPATING THIN FILM AND METHOD FOR MANUFACTURING SAME

CROSS-REFERENCE TO RELATED APPLICATIONS

This application is a continuation of International Patent Application PCT/KR2018/002591 (filed 5 Mar. 2018), which claims the benefit of Republic of Korea Patent Application 10-2017-0083745 (filed 30 Jun. 2017). The application also claims the benefit of Republic of Korea Patent Application 10-2019-0055607 (filed 13 May 2019). The entire disclosure of each of these priority applications is hereby incorporated by reference herein.

BACKGROUND OF THE INVENTION

1. Field of the Invention

The present invention relates to a high heat radiation thin film and a method of fabricating the same, and more particularly to a high heat radiation thin film including a carbon layer on a metal substrate and a method of fabricating the same.

2. Description of the Related Art

Recently, the electronic equipment used in automobile, electrical and electronic fields and the like have been in pursuit of being lighter, thinner, smaller and more multi-functional. As such electronic elements are highly integrated, a more amount of heat is produced. Such radiated heat not only deteriorates the functions of elements, but also causes a malfunction of surrounding elements, a deterioration of substrates, etc., and thus keen attention has been paid to studying a technology for controlling the radiated heat.

When taking the components of heat radiation materials into consideration, most of those materials are composite materials, which are a mixture of polymer materials with high thermal conductive filler materials such as carbon materials or ceramic materials. The thermal conductive polymers may give the characteristics of metal and ceramic materials while maintaining the advantages of conventional polymer materials as they are, such as easy processability, low cost, light weight, diversity of product forms, etc. Further, the reason for using the composite materials is that the high thermal conductive inorganic filler materials have an excellent thermal conductivity but with no adhesive strength, while the polymer materials have an excellent adhesive strength but with a low thermal conductivity. However, to achieve a high thermal conductance of polymer composite materials, it is required to use a large amount of fillers. In this case, however, there is a problem in that processing conditions become difficult and physical properties of products deteriorate.

Korean Patent Registration Publication No. 10-1534232 discloses an invention which effectively decreases a temperature of heat sources of electric & electronic products, which are installed in a narrow space due to integration, by using a heat sink formed with a high heat radiation organic & inorganic composite coating film.

SUMMARY OF THE INVENTION

One technical object of the present invention is to provide a high heat radiation thin film with an improved thermal conductance, and a method of fabricating the same.

Another technical object of the present invention is to provide a high heat radiation thin film with a simplified fabricating process, and a method of fabricating the same.

Still another technical object of the present invention is to provide a high heat radiation thin film with a less fabricating cost, and a method of fabricating the same.

The technical objects of the present invention are not limited to the above.

To solve the technical objects above, the present invention provides the high heat radiation thin film.

According to one embodiment, the high heat radiation thin film may include a metal substrate, and a carbon layer which is disposed on the metal substrate and is thicker than 2.5 nm and thinner than 10 nm.

According to one embodiment, the carbon layer may include graphene.

According to one embodiment, the metal substrate may include at least one of aluminum, copper or iron.

According to one embodiment, the method of fabricating the high heat radiation thin film may include: preparing a metal substrate; forming a preliminary carbon layer by providing carbon ions onto the metal substrate; and forming a carbon layer on the metal substrate by heat-treating the metal substrate and the preliminary carbon layer, in which the carbon layer may include a carbon layer having a thermal conductivity higher than that of the preliminary carbon layer.

According to one embodiment, a temperature of the heat treatment may be controlled depending on a type of the metal substrate.

According to one embodiment, if the metal substrate includes aluminum, the heat treatment may be performed at more than 350° C. and less than 500° C.

According to one embodiment, if the metal substrate includes copper, the heat treatment may be performed at more than 500° C. and less than 900° C.

According to one embodiment, the heat treatment may be performed under an oxygen-free and hydrogen-free atmosphere.

According to one embodiment, the carbon atoms in the preliminary carbon layer may be rearranged by the heat treatment, and thus the carbon layer may include graphene.

According to one embodiment, a thickness of the carbon layer may be more than 2.5 nm and less than 10 nm.

To solve the technical objects above, the present application provides a method of fabricating a high heat radiation thin film including a carbon material.

According to one embodiment, the method of fabricating the high heat radiation thin film including the carbon material includes: preparing a first metal film; and forming a first carbon layer coming into direct contact with a first surface of the first metal film, in which the forming of the first carbon layer includes providing carbon ions onto the first surface of the first metal film and heat-treating the first metal film provided with the carbon ions.

According to one embodiment, the method of fabricating the high heat radiation thin film including the carbon material includes: forming a second carbon layer on a second surface which faces the first surface of the first metal film, in which the forming of the second carbon layer may include preparing a carbon coating material including graphite powder and binders and coating the second surface of the first metal film.

According to one embodiment, the first carbon layer may include a graphitic carbon layer and the second carbon layer may be thicker than the first carbon layer.

According to one embodiment, the method of fabricating a high heat radiation thin film including a carbon layer may include a carbon material which further includes bonding a second metal film onto the first carbon layer.

To solve the technical objects above, the present application provides a high heat radiation thin film including a carbon material.

According to one embodiment, the high heat radiation thin film including the carbon material may include a first metal film, and a first carbon layer coming into direct contact with a first surface of the first metal film, in which the first carbon layer may include a graphitic carbon layer.

According to one embodiment, the high heat radiation thin film including the carbon material may further include a second carbon layer on a second surface which faces the first surface of the first metal film, in which the second carbon layer may include graphite powder and binders.

According to one embodiment, the high heat radiation thin film including the carbon layer may further include a second metal film bonded onto the first carbon layer by an adhesive layer.

A high heat radiation thin film according to an embodiment of the present invention may include a carbon layer disposed on a metal substrate, in which the carbon layer may be thicker than 2.5 nm and thinner than 10 nm and include graphene. Accordingly, the high heat radiation thin film with an improved thermal conductivity may be provided.

Further, the high heat radiation thin film may be fabricated by a simple process for forming a preliminary carbon layer by providing carbon ions onto the metal substrate, and then heat-treating the preliminary carbon layer. Accordingly, the method of fabricating a high heat radiation thin film with a less fabricating cost and a simpler fabricating process may be provided.

A high heat radiation thin film including a carbon material according to an embodiment of the present invention may include a first metal film and a first carbon layer coming into direct contact with a first surface of the first metal film, in which the first carbon layer may include a graphitic carbon layer.

Alternatively, the high heat radiation thin film including the carbon material may further include a second carbon layer on a second surface which faces the first surface of the first metal film, in which the first carbon layer may include a graphitic carbon layer and the second carbon layer may include graphite powder and binders.

Accordingly, the high heat radiation thin film including the carbon material with an improved heat radiation property may be provided.

BRIEF DESCRIPTION OF THE DRAWINGS

FIG. 1 is a view for explaining a method of fabricating a high heat radiation thin film according to a first embodiment of the present invention.

FIGS. 2 and 3 are sectional views for explaining a high heat radiation thin film according to a first embodiment of the present invention and a method of fabricating the same.

FIG. 4 is a view for explaining a structure of a carbon layer included in a heat high radiation thin film according to a first embodiment of the present invention.

FIG. 5 is a graph measuring a thermal conductivity of high heat radiation thin films according to Experimental Embodiments 1-1 to 1-3 of the present invention and thin films according to Comparative Embodiments 1-1 and 1-2 of the present invention.

FIG. 6 is a graph measuring a thermal conductivity of a high heat radiation thin film according to Experimental Embodiments 1-3 of the present invention depending on a temperature of heat treatment.

FIG. 7 is a graph measuring a thermal conductivity of high heat radiation thin films according to Experimental Embodiments 2-1 to 2-6 of the present invention.

FIG. 8 is a view for explaining a high heat radiation thin film including a carbon material according to a second embodiment of the present invention, and a method of fabricating the same.

FIG. 9 is a view for explaining a high heat radiation thin film including a carbon material according to a third embodiment of the present invention, and a method of fabricating the same.

FIG. 10 is a view for explaining a high heat radiation thin film including a carbon material according to a fourth embodiment of the present invention, and a method of fabricating the same.

FIG. 11 is a view showing a structure of heat radiation thin films according to Experimental Embodiments 3-1 to 3-8 of the present invention.

FIG. 12 is a view for explaining a method of measuring a heat radiation property of heat radiation thin films according to Experimental Embodiments 3-1 to 3-8 of the present invention.

FIG. 13 is a view for explaining another method of measuring a heat radiation property of heat radiation thin films according to Experimental Embodiments 3-1 to 3-8 of the present invention.

FIG. 14 is a view showing a structure of heat radiation thin films according to Experimental Embodiments 4-1 to 4-12 of the present invention.

FIG. 15 is a graph measuring a thermal conductivity of heat radiation thin films according to Experimental Embodiments 5-1 to 5-3 of the present invention and thin films according to Comparative Embodiments 3-1 and 3-2 of the present invention.

FIG. 16 is a graph measuring a thermal conductivity of a heat radiation thin film according to Experimental Embodiment 5-3 of the present invention depending on a temperature of heat treatment.

FIG. 17 is a graph measuring a thermal conductivity of high heat radiation thin films according to Experimental Embodiments 6-1 to 6-6 of the present invention.

DETAILED DESCRIPTION OF THE EXEMPLARY EMBODIMENTS

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added.

Further, in the following description of the present invention, a detailed description of known functions and configurations incorporated herein will be omitted when it may make the subject matter of the present invention unnecessarily unclear.

FIG. 1 is a view for explaining a method of fabricating a high heat radiation thin film according to a first embodiment of the present invention, FIGS. 2 and 3 are sectional views for explaining a high heat radiation thin film according to a first embodiment of the present invention, and a method of fabricating the same, and FIG. 4 is a view for explaining a structure of a carbon layer included in a high heat radiation thin film according to a first embodiment of the present invention.

Referring to FIGS. 1 to 4, a metal substrate 11 is prepared (S110). According to one embodiment, the metal substrate 11 may include an aluminum substrate. Alternatively, according to another embodiment, the metal substrate 11 may include a copper substrate. Alternatively, according to still another embodiment, the metal substrate 11 may include a substrate including iron.

A preliminary carbon layer 12 may be formed by providing carbon ions onto the metal substrate 11 (S120). According to one embodiment, the providing of the carbon ions onto the metal substrate 11 may include disposing the metal substrate 11 in a chamber, and releasing the carbon ions from a carbon source by applying energy to the carbon source in the chamber. Specifically, the carbon ions may be released by disposing a carbon ingot in the chamber and applying heat or electric energy to the carbon ingot. In this case, the chamber may be under an inert gas atmosphere (for example, argon gas) and may have a pressure condition of 10-15 mTorr.

The preliminary carbon layer 12 may be formed in such a way that the carbon ions are deposited onto the metal substrate 11. According to one embodiment, the carbon atoms in the preliminary carbon layer 12 may be in a state of being randomly arranged.

According to one embodiment, the metal substrate 11 may be subjected to pre-treatment such that the carbon ions may be easily deposited onto the metal substrate 11. Specifically, for example, a passivation film (for example, an oxide film) may be formed on the metal substrate 11. Due to the passivation film, the carbon ions may be less inserted into the metal substrate 11. In contrast, if a plurality of the carbon ions are inserted into the metal substrate 11, it is not easy to form the preliminary carbon layer 12 on the metal substrate 11. In this case, it is not easy to fabricate a carbon layer 13 having graphene by heat-treating the preliminary carbon layer 12 as will be described below.

The carbon layer 13 may be formed on the metal substrate 11 by heat-treating the metal substrate 11 and the preliminary carbon layer 12. The carbon atoms in the preliminary carbon layer 12 may be rearranged by the heat treatment in a state of having been randomly arranged. Accordingly, the carbon layer 13 may include graphene formed in such a way that the carbon atoms in the preliminary carbon layer 12 are rearranged. In other words, the carbon layer 13 may have a honeycomb structure as shown in FIG. 4, in such a way that the carbon atoms are rearranged.

According to one embodiment, the carbon layer 13 may include graphene as a whole. Alternatively, according to another embodiment, at least a part of the carbon layer 13 may include graphene, while a remaining part thereof may be in a state in which carbon atoms are randomly arranged. In other words, in a plane viewpoint, some areas of the carbon layer 13 may include graphene, while remaining some areas thereof may be in a state in which carbon atoms are randomly arranged. Alternatively, in a sectional viewpoint, some areas of the carbon layer 13 may include graphene, while remaining some areas thereof may be in a state in which carbon atoms are randomly arranged.

Accordingly, the carbon layer 13 may have a thermal conductivity higher than that of the preliminary carbon layer 12. Specifically, according to one embodiment, the thermal conductance of a high heat radiation thin film including the metal substrate 11 and the carbon layer 13 may be about 380 W/mk or more.

Compared to the case where a thickness of the carbon layer 13 is 2.5 nm or less or 10 nm or more, in the case where the thickness of the carbon layer 13 is more than 2.5 nm and less than 10 nm, a thin film including the metal substrate 11 and the carbon layer 13 may have a remarkably high thermal conductivity. Thus, according to one embodiment, the thickness of the carbon layer 13 may be more than 2.5 nm and less than 10 nm.

Further, according to one embodiment, a temperature of the heat treatment may be controlled depending on a type of the metal substrate 11. Accordingly, the thermal conductivity of the thin film including the metal substrate 11 and the carbon layer 13 may be controlled. Specifically, for example, if the metal substrate 11 includes aluminum and if the heat treatment is performed at 350° C. or less or 500° C. or more, the thermal conductivity may be deteriorated. Accordingly, if the metal substrate 11 includes aluminum, the heat treatment may be performed at more than 350° C. and less than 500° C. Alternatively, for another example, if the metal substrate 11 includes copper and if the heat treatment is performed at 500° C. or less or 900° C. or more, the thermal conductivity may be deteriorated. Accordingly, if the metal substrate 11 includes copper, the heat treatment may be performed at more than 500° C. and less than 900° C.

If the heat treatment is performed under an atmosphere including oxygen or under an atmosphere including hydrogen, the carbons included in the preliminary carbon layer 12 react with oxygen and hydrogen to produce $CO_2$ and $CH_3$ gases. Accordingly, it is not easy to fabricate the carbon layer 13 from the preliminary carbon layer 12. Accordingly, according to an embodiment of the present invention, the heat treatment may be performed under an oxygen-free and hydrogen-free atmosphere. Specifically, the heat treatment may be performed under a nitrogen gas atmosphere or under an inert gas atmosphere (for example, argon).

The heat treatment may be performed by various methods. According to one embodiment, the heat treatment may be performed by using a furnace. Alternatively, according to another embodiment, the heat treatment may be performed by a joule heating method. Specifically, the heat treatment may be performed by a method that allows a plurality of electrodes to come into contact with the preliminary carbon layer 12 and applies an electric current through the plurality of electrodes. In this case, a path of electric current may be formed between the plurality of electrodes, and some areas of the preliminary carbon layer 12 adjacent to the path of electric current or the entire preliminary carbon layer 12 may be converted into the carbon layer 12 (graphene). Accordingly, the carbon layer 12 may be easily formed by minimizing a heat-caused damage to the metal substrate 11 and locally applying a high temperature heat to the preliminary carbon layer 12.

According to an embodiment of the present invention, the carbon layer 13 including graphene may be formed on the metal substrate 11 by providing the carbon ions onto the metal substrate 11 to form the preliminary carbon layer 12, and then heat-treating the preliminary carbon layer 12. Accordingly, a thermal conductivity may be improved by the graphene in the carbon layer 13. Accordingly, a high heat radiation thin film including the metal substrate 11 and the carbon layer 13 may be provided.

Further, according to an embodiment of the present invention, the high heat radiation thin film may be fabricated by a simple process of providing the carbon ions onto the metal substrate 11 and performing a heat treatment as described in detail above.

Hereinafter, the description will be made on specific experimental embodiments and the results thereof with regard to the high heat radiation thin film according to an embodiment of the present invention as described in detail above and the method of fabricating the same.

Fabricating of High Heat Radiation Thin Films According to Experimental Examples 1-1 to 1-3

A 30 μm aluminum substrate was prepared as a metal substrate. Carbon ions were provided onto the aluminum substrate to form a preliminary carbon layer, and then a heat treatment process was performed at 400° C. Specifically, the heat treatment process was performed for 30 minutes while raising a temperature at 15° C./min. According to Experimental Embodiments 1-1 to 1-3 of the present invention, a high heat radiation thin film with a 2.5 nm carbon layer, a 5 nm carbon layer and a 10 nm carbon layer formed on the aluminum substrate was fabricated.

Thin Film According to Comparative Embodiment 1-1

A 30 μm aluminum substrate was prepared as a Comparative Embodiment of the high heat radiation thin films according to Experimental Embodiments 1-1 to 1-3 of the present invention as described in detail above.

Thin Film According to Comparative Embodiment 1-2

A 30 μm aluminum substrate was prepared as a Comparative Embodiment of the high heat radiation thin films according to Experimental Embodiments 1-1 to 1-3 of the present invention as described in detail above, and carbon ions were provided onto the aluminum substrate to form a preliminary carbon layer with a thickness of 5 nm in the same way as the method according to Experimental Embodiments 1-1 to 1-3 as described in detail above. After that, the heat treatment process was not performed unlike the method according to Experimental Embodiments 1-1 to 1-3 as described in detail above.

The high heat radiation thin films according to Experimental Embodiments 1-1 to 1-3 and the thin films according to Comparative Embodiments 1-1 and 1-2 as described in detail above may be summarized as shown in the following Table 1.

TABLE 1

| Classification | Metal substrate | Thickness of carbon layer | Temperature of heat treatment | Thermal conductivity |
| --- | --- | --- | --- | --- |
| Experimental Embodiment 1-1 | Al | 2.5 nm | 400° C. | 339 W/mK |
| Experimental Embodiment 1-2 | | 5 nm | 400° C. | 384 W/mK |
| Experimental Embodiment 1-3 | | 10 nm | 400° C. | 297 W/mK |
| Comparative Embodiment 1-1 | | — | — | 221 W/mK |
| Comparative Embodiment 1-2 | | 5 nm | — | 236 W/mK |

Measuring of Thermal Conductivity of High Heat Radiation Thin Films According to Experimental Embodiments 1-1 to 1-3 and Thin Films According to Comparative Embodiments 1-1 and 1-2

FIG. 5 is a graph measuring a thermal conductivity of high heat radiation thin films according to Experimental Embodiments 1-1 to 1-3 of the present invention and thin films according to Comparative Embodiments 1-1 and 1-2 of the present invention.

Referring to FIG. 5, a measurement was made about the thermal conductivity of high heat radiation thin films according to Experimental Embodiments 1-1 to 1-3 and the thin films according to Comparative Embodiments 1-1 and 1-2 as described in detail above. Specifically, a measurement was made with an LFA equipment of NETZSH about the thermal conductivity of high heat radiation thin films according to Experimental Embodiments 1-1 to 1-3 and the thin films according to Comparative Embodiments 1-1 and 1-2 as described in detail above. The results of measurement are summarized as shown in the following Table 2 and FIG. 5.

TABLE 2

| Classification | Thickness of carbon layer | Thermal conductivity |
| --- | --- | --- |
| Experimental Embodiment 1-1 | 2.5 nm | 339 W/mK |
| Experimental Embodiment 1-2 | 5 nm | 384 W/mK |
| Experimental Embodiment 1-3 | 10 nm | 297 W/mK |
| Comparative Embodiment 1-1 | — | 221 W/mK |
| Comparative Embodiment 1-2 | 5 nm | 236 W/mK |

As may be seen from FIG. 5 and Table 2, it may be confirmed that the high heat radiation thin films according to Experimental Embodiments 1-1 to 1-3 have a remarkably high thermal conductivity, compared to the aluminum thin film according to Comparative Embodiment 1-1 without a carbon layer formed thereon.

Further, in case of the thin film according to Comparative Embodiment 1-2 without the heat treatment process performed after forming the preliminary carbon layer onto the aluminum substrate, it was measured that a thermal conductivity thereof is slightly higher than that of the aluminum thin film according to Comparative Embodiment 1-1 without the preliminary carbon layer and the carbon layer formed thereon. However, it may be confirmed that the thermal conductivity thereof is remarkably lower than that of the high heat radiation thin films according to Experimental Embodiments 1-1 to 1-3 with the carbon layer formed thereon by performing the heat treatment process.

Consequently, it may be confirmed that providing the carbon ions onto the aluminum substrate to form the preliminary carbon layer and performing the heat treatment process is an efficient method for improving the thermal conductivity of thin films.

Further, when comparing Examples 1-1 to 1-3 with each other, it may be confirmed that the thermal conductivity is controlled depending on the thickness of the carbon layer. Specifically, in the case where the thickness of the carbon layer is 5 nm according to Experimental Embodiment 1-2, it may be confirmed that the thermal conductivity thereof is remarkably higher than in the case where the thickness of the carbon layer is 2.5 nm according to Experimental Embodiment 1-1 and in the case where the thickness of the carbon layer is 10 nm according to Experimental Embodiment 1-3. Specifically, in the case of the high heat radiation thin film according to Experimental Embodiment 1-2, it may be confirmed that the thermal conductivity thereof is about at least 13% higher than that of the heat radiation thin film according to Experimental Embodiment 1-1 and the thermal conductivity thereof is about at least 29% higher than that of the high heat radiation thin film according to Experimental Embodiment 1-3.

Consequently, it may be confirmed that controlling the thickness of the carbon layer formed on the metal substrate to be more than 2.5 nm and less than 10 nm is an efficient method for improving the thermal conductivity of thin films.

Measuring of Thermal Conductivity Depending on Temperature of Heat Treatment

FIG. 6 is a graph measuring a thermal conductivity of a high heat radiation thin film according to Experimental Embodiment 1-3 of the present invention depending on a temperature of heat treatment.

Referring to FIG. 6, the carbon layer with a thickness of 10 nm was formed on the aluminum substrate according to Experimental Embodiment 1-3 as described in detail above, in which the temperature of heat treatment was controlled to be 300° C., 350° C., 400° C., 450° C., 500° C. and 600° C. The thermal conductivity of the high heat radiation thin films with a different temperature of heat treatment was measured with an LFA equipment of NETZSH. The results of measurement are summarized as shown in the following Table 3 and FIG. 6.

TABLE 3

| Classification | Metal substrate | Thickness of carbon layer | Temperature of heat treatment | Thermal conductivity |
|---|---|---|---|---|
| Experimental Embodiment 1-3 | Al | 10 nm | 300° C. | 245 W/mK |
| | | | 350° C. | 256 W/mK |
| | | | 400° C. | 297 W/mK |
| | | | 450° C. | 290 W/mK |
| | | | 500° C. | 241 W/mK |
| | | | 600° C. | 203 W/mK |

As may be seen from FIG. 6 and Table 3, it may be confirmed that the thermal conductivity is controlled depending on the temperature of heat treatment. Specifically, in the case where the temperature of heat treatment is more than 350° C. and less than 500° C., it may be confirmed that the thermal conductivity thereof is remarkably higher than in the case where the temperature of heat treatment is 300-350° C. and in the case where the temperature of heat treatment is 500~600° C. Specifically, in the case where the temperature of heat treatment is 400° C., it was measured that the thermal conductivity thereof is highest as 297 W/mk and it was also measured that the thermal conductivity thereof is about 21% higher than in the case where the temperature of heat treatment is 300° C.; about 16% higher than in the case where the temperature of heat treatment is 350° C.; about 23% higher than in the case where the temperature of heat treatment is 500° C.; and about 46% higher than in the case where the temperature of heat treatment is 600° C.

Consequently, with regard to the heat treatment process for fabricating the carbon layer after forming the preliminary carbon layer on the aluminum substrate, it may be confirmed that adjusting the temperature thereof to be more than 350° C. and less than 500° C. is an efficient method for improving the thermal conductivity of thin films.

Fabricating of High Heat Radiation Thin Films According to Experimental Embodiments 2-1 to 1-6

A 35 μm copper substrate was prepared as a metal substrate. Carbon ions were provided onto the copper substrate to form a preliminary carbon layer, and then a heat treatment process was performed while varying a temperature. Specifically, the heat treatment process was performed for 30 minutes at 400° C., 500° C., 600° ° C., 700° C., 800° C. and 900° C. while raising a temperature at 15° C./min, and thus a high heat radiation thin film with a 5 nm-thick carbon layer formed on the copper substrate was fabricated according to Experimental Embodiments 2-1 to 2-6 of the present invention.

Thin Film According to Comparative Embodiment 2-1

A 35 μm copper substrate was prepared as a Comparative Embodiment of the high heat radiation thin films according to Experimental Embodiments 2-1 to 2-6 of the present invention as described in detail above.

Thin Film According to Comparative Embodiment 2-2

A 35 μm copper substrate was prepared as a Comparative Embodiment of the high heat radiation thin films according to Experimental Embodiments 2-1 to 2-6 of the present invention as described in detail above, and carbon ions were provided onto the copper substrate to form a preliminary carbon layer with a thickness of 5 nm in the same way as the method according to Experimental Embodiments 2-1 to 2-6 as described in detail above. After that, the heat treatment process was not performed unlike the method according to Experimental Embodiments 2-1 to 2-6 as described in detail above.

The high heat radiation thin films according to Experimental Embodiments 2-1 to 2-6 and the thin films according to Comparative Embodiments 2-1 and 2-2 as described in detail above may be summarized as shown in the following Table 4.

TABLE 4

| Classification | Metal substrate | Thickness of carbon layer | Temperature of heat treatment |
|---|---|---|---|
| Experimental Embodiment 2-1 | Cu | 5 nm | 400° C. |
| Experimental Embodiment 2-2 | | | 500° C. |
| Experimental Embodiment 2-3 | | | 600° C. |
| Experimental Embodiment 2-4 | | | 700° C. |
| Experimental Embodiment 2-5 | | | 800° C. |
| Experimental Embodiment 2-6 | | | 900° C. |
| Comparative Embodiment 2-1 | | — | — |
| Comparative Embodiment 2-2 | | 5 nm | — |

Measuring of Thermal Conductivity of High Heat Radiation Thin Films According to Experimental Embodiments 2-1 to 2-6 and Thin Films According to Comparative Embodiments 2-1 and 2-2

FIG. 7 is a graph measuring a thermal conductivity of high heat radiation thin films according to Experimental Embodiments 2-1 to 2-6 of the present invention.

Referring to FIG. 7, a measurement was made with an LFA equipment of NETZSH about the thermal conductivity of high heat radiation thin films according to Experimental Embodiments 2-1 to 2-6 and thin films according to Comparative Embodiments 2-1 and 2-2 as described in detail above. The results of measurement are summarized as shown in the following Table 5 and FIG. 7.

TABLE 5

| Classification | Temperature of heat treatment | Thermal conductivity |
|---|---|---|
| Experimental Embodiment 2-1 | 400° C. | 327 W/mK |
| Experimental Embodiment 2-2 | 500° C. | 339 W/mK |
| Experimental Embodiment 2-3 | 600° C. | 409 W/mK |
| Experimental Embodiment 2-4 | 700° C. | 435 W/mK |
| Experimental Embodiment 2-5 | 800° C. | 460 W/mK |
| Experimental Embodiment 2-6 | 900° C. | 384 W/mK |
| Comparative Embodiment 2-1 | — | 298 W/mK |
| Comparative Embodiment 2-2 | — | 313 W/mK |

As may be seen from FIG. 7 and Table 5, it may be confirmed that the high heat radiation thin films according to Experimental Embodiments 2-1 to 2-6 have a remarkably high thermal conductivity, compared to the copper thin film according to Comparative Embodiment 2-1 without a carbon layer formed thereon.

Further, in case of the thin film according to Comparative Embodiment 2-2 without the heat treatment process performed after forming the preliminary carbon layer onto the copper substrate, it was measured that a thermal conductivity thereof is slightly higher than that of the copper thin film according to Comparative Embodiment 2-1 without the preliminary carbon layer and the carbon layer formed thereon. However, it may be confirmed that the thermal conductivity thereof is remarkably lower than that of the high heat radiation thin films according to Experimental Embodiments 2-1 to 2-6 with the carbon layer formed thereon by performing the heat treatment process.

Consequently, it may be confirmed that providing the carbon ions onto the copper substrate to form the preliminary carbon layer and performing the heat treatment process is an efficient method for improving the thermal conductivity of thin films.

Further, it may be confirmed that the thermal conductivity is controlled depending on the temperature of heat treatment. Specifically, in the case where the temperature of heat treatment is more than 500° C. and less than 900° C., it may be confirmed that the thermal conductivity thereof is remarkably higher than in the case where the temperature of heat treatment is 400-500° C. and in the case where the temperature of heat treatment is 900° C. Specifically, in the case where the temperature of heat treatment is 800° C., it was measured that the thermal conductivity thereof is highest as 460 W/mk and it was measured that the thermal conductivity thereof is about 41% higher than in the case where the temperature of heat treatment is 400° C.; about 36% higher than in the case where the temperature of heat treatment is 500° C.; and about 20% higher than in the case where the temperature of heat treatment is 900° C.

Consequently, with regard to the heat treatment for fabricating the carbon layer after forming the preliminary carbon layer on the copper substrate, it may be confirmed that adjusting the temperature thereof to be more than 500° C. and less than 900° C. is an efficient method for improving the thermal conductivity of thin films.

Further, referring to FIG. 6, Table 3, FIG. 7 and Table 5, it may be confirmed that a range of temperatures of heat treatment having a maximum value of thermal conductivity varies depending on a type of metal substrates used therein. In other words, it may be confirmed that controlling the temperature of heat treatment depending the type of metal substrates is an effective method for improving the thermal conductivity.

FIG. 8 is a view for explaining a high heat radiation thin film including a carbon material according to a second embodiment of the present invention, and a method of fabricating the same.

Referring to FIG. 8, a high heat radiation thin film 100a including a carbon material according to a second embodiment of the present invention may include a metal film 110, a carbon layer 120 and an adhesion layer 130.

The metal film 110 may include copper, aluminum or an alloy thereof. For example, a thickness of the metal film 110 may be 72 μm.

The carbon layer 120 may be disposed on a first surface of the metal film 110. According to one embodiment, forming the carbon layer 120 may include forming a preliminary carbon layer by providing carbon ions onto the first surface of the metal film 110, and forming the carbon layer 120 on the metal film 110 by heat-treating the metal film 110 and the preliminary carbon layer.

According to one embodiment, the providing of the carbon ions onto the metal film 110 may include disposing the metal film 100 in a chamber, and releasing the carbon ions from a carbon source by applying energy to the carbon source in the chamber. Specifically, the carbon ions may be released by disposing a carbon ingot within the chamber and applying heat or electric energy to the carbon ingot. In this case, the chamber may be under an inert gas atmosphere (for example, argon gas) and may have a pressure condition of 10-15 mTorr. The preliminary carbon layer may be formed in such a way that the carbon ions are deposited onto the metal film 110. According to one embodiment, the carbon atoms in the preliminary carbon layer may be in a state of being randomly arranged.

According to one embodiment, the metal film 110 may be subjected to pre-treatment such that the carbon ions may be easily deposited onto the metal film 110. Specifically, for example, a passivation film (for example, an oxide film) may be formed on the metal film 110. Due to the passivation film, the carbon ions may be less inserted into the metal film 110. In contrast, if a plurality of the carbon ions are inserted into the metal film 110, it is not easy to form the preliminary carbon layer on the metal film 110. In this case, it is not easy to fabricate the carbon layer 120 by heat-treating the preliminary carbon layer. For example, the passivation film may include an oxide film as described in detail above, or may include an alloy film, specifically an alloy film of nickel (Ni) and chrome (Cr) (a rate of nickel and chrome is 95:5). Accordingly, the carbon layer 120 may be easily fixed and attached onto the metal film 110.

The carbon atoms in the preliminary carbon layer may be rearranged by the heat treatment in a state of having been randomly arranged. Accordingly, the carbon layer 120 may be a graphitic carbon layer formed in such a way that the carbon atoms in the preliminary carbon layer are rearranged.

According to one embodiment, a temperature of the heat treatment may be controlled depending on a type of the metal film 110, and thus a thermal conductivity of the thin film including the metal film 110 and the carbon layer 120 may be controlled. Specifically, for example, if the metal film 110 includes aluminum and if the heat treatment is performed at 350° C. or less or 500° C. or more, the thermal conductivity may be deteriorated. Accordingly, if the metal film 110 includes aluminum, the heat treatment may be performed at more than 350° C. and less than 500° C. Alternatively, for another example, if the metal film 110 includes copper and if the heat treatment is performed at 500° C. or less or 900° C. or more, the thermal conductivity may be deteriorated. Accordingly, if the metal film 110 includes copper, the heat treatment may be performed at more than 500° C. and less than 900° C.

If the heat treatment is performed under an atmosphere including oxygen or under an atmosphere including hydrogen, the carbons included in the preliminary carbon layer react with oxygen and hydrogen to produce CO2 and CH3 gases. Accordingly, it is not easy to fabricate the carbon layer 120 from the preliminary carbon layer. Accordingly, according to an embodiment of the present invention, the heat treatment may be performed under an oxygen-free and hydrogen-free atmosphere. Specifically, the heat treatment may be performed under a nitrogen gas atmosphere or under an inert gas atmosphere (for example, argon).

The heat treatment may be performed by various methods. According to one embodiment, the heat treatment may be performed by using a furnace. Alternatively, according to another embodiment, the heat treatment may be performed by a joule heating method. Specifically, the heat treatment may be performed by a method that allows a plurality of electrodes to come into contact with the preliminary carbon layer and applies an electric current through the plurality of electrodes. In this case, a path of electric current may be formed between the plurality of electrodes, and some areas of the preliminary carbon layer adjacent to the path of electric current or the entire preliminary carbon layer may be converted into the carbon layer 120. Accordingly, the carbon layer 120 may be easily formed by minimizing a heat-caused damage to the metal film 110 and locally applying a high temperature heat to the preliminary carbon layer.

The carbon layer 120 may be disposed on the adhesion layer 130. The adhesion layer 130 may include a pressure sensitive adhesive film. For example, a thickness of the adhesion layer 130 may be 32 μm.

FIG. 9 is a view for explaining a high heat radiation thin film including a carbon material according to a third embodiment of the present invention, and a method of fabricating the same.

Referring to FIG. 9, a high heat radiation thin film 100b including a carbon material according to a third embodiment of the present invention may include a metal film 110, a first carbon layer 120a, a second carbon layer 120b and an adhesion layer 130.

The metal film 110 may be copper, aluminum or an alloy thereof. For example, a thickness of the metal film 110 may be 70 μm.

The first carbon layer 120a may be disposed on a first surface of the metal film 110. The first carbon layer 120a may include a graphitic carbon layer as described with reference to FIG. 1. A thickness of the first carbon layer 120a may be less than that of the second carbon layer 120b.

The second carbon layer 120b may be disposed on a second surface of the metal film 110. The second carbon layer 120b may include a carbon material (for example, graphite powder, graphene, CNT, etc.). For example, a thickness of the second carbon layer 120b may be 5 μm. According to one embodiment, forming the second carbon layer 120b may include preparing a carbon material including graphite powder and binders, and coating the second surface of the metal film 110.

According to one embodiment, before the second carbon layer 120b is formed on the second surface of the metal film 110, the first carbon layer 120a may be formed on the first surface of the metal film 100 before the second carbon layer 120b is formed thereon. Accordingly, the second carbon layer 120b may be prevented from being damaged and deteriorated by a heat treatment process which is performed during a process of fabricating the first carbon layer 120a.

The adhesion layer 130 may be disposed on the second carbon layer 120b. The adhesion layer 130 may be a pressure sensitive adhesive film. For example, a thickness of the adhesion layer 130 may be 25 μm.

FIG. 10 is a view for explaining a high heat radiation thin film including a carbon material according to a fourth embodiment of the present invention, and a method of fabricating the same.

Referring to FIG. 10, a high heat radiation thin film 100c including a carbon material according to a fourth embodiment of the present invention may include a first metal film 110a, a second metal film 110b, a first carbon layer 120a, a second carbon layer 120b, a first adhesion layer 130a and a second adhesion layer 130b.

The first metal film 110a may include copper, aluminum or an alloy thereof. For example, a thickness of the first metal film 110 may be 25 μm.

The first carbon layer 120a may be disposed on a first surface of the first metal film 110a. The first carbon layer 120a may include a graphitic carbon layer as described with reference to FIG. 1. A thickness of the first carbon layer 120a may be less than that of the second carbon layer 120b.

The second carbon layer 120b may be disposed on a second surface of the first metal film 110a. The second carbon layer 120b may include a carbon material (for example, graphite powder, graphene, CNT, etc.). For example, a thickness of the second carbon layer 120b may be 5 μm. According to one embodiment, the second carbon layer 120b may be formed by the method as described with reference to FIG. 2.

According to one embodiment, before the second carbon layer 120b is formed on the second surface of the metal film 110, the first carbon layer 120a may be formed on the first surface of the metal film 100a before the second carbon layer 120b is formed thereon.

The first adhesion layer 130a may be disposed on the second carbon layer 120b. The adhesion layer 130a may include a pressure sensitive adhesive film. For example, a thickness of the adhesion layer 130a may be 25 μm.

The second metal film 110b may include copper, aluminum or an alloy thereof. For example, a thickness of the second metal film 110b may be 35 μm.

The second adhesion layer 130b may be provided between the second metal film 110b and the first carbon layer 120a. In other words, the second metal film 110b may be bonded onto the first carbon layer 120a by the second adhesion layer 130b.

The second adhesive layer 130b may include a pressure sensitive adhesive film. For example, a thickness of the second adhesion layer 130b may be 5 μm.

The first metal film 110a, the first carbon layer 120a, the second carbon layer 120b and the first adhesion layer 130a may be defined as a first film structure, and the second metal film 110b and the second adhesion layer 130b may be defined as a second film structure. According to one embodiment, after the first film structure and the second film structure are fabricated respectively as described in detail above, the first film structure and the second film structure may be bonded onto each other by the second adhesion layer 130b to provide one high heat radiation thin film.

Hereinafter, the description will be made on the results of evaluating the property of the high heat radiation thin films including carbon materials according to specific experimental embodiments of the present invention.

FIG. 11 is a view showing a structure of heat radiation thin films according to Experimental Embodiments 3-1 to 3-8 of the present invention.

Referring to FIG. 11, heat radiation thin films according to Experimental Embodiments 3-1 to 3-8, which all have the same thickness of 104 μm, were prepared as shown in FIG. 11. In FIG. 11, GB means a carbon layer which is fabricated by using graphite powder and binders as described with reference to FIGS. 9 and 10, GCL refers to a graphitic carbon layer as described with reference to FIG. 8, and PSA stands for an adhesion layer.

FIG. 12 is a view for explaining a method of measuring a heat radiation property of heat radiation thin films according to Experimental Embodiments 3-1 to 3-8 of the present invention.

Referring to FIG. 12, a heat source and specimens (heat radiation thin films according to Experimental Embodiments 3-1 to 3-8) were prepared as shown in FIG. 12 and a temperature thereof was measured in each area (Sp1-Sp10) as shown in the following Tables 6 to 9. Measurement of temperatures was performed twice with regard to each of the heat radiation thin films according to Experimental Embodiments 3-1 to 3-8, a temperature condition of the heat source was set at 80° C., and 10 μm one-sided black PET tape was attached to a surface of the heat radiation thin films according to Experimental Embodiments 3-1 to 3-8.

As may be confirmed from the following Tables 6 to 9, it may be confirmed that using a rolled copper film improves a heat radiation effect compared to using an electrolytic deposited copper film. Further, it may be confirmed that a structure of Experimental Embodiment 3-7, that is, a structure of sequentially laminating an adhesion layer, a graphitic carbon layer and a metal film of roller copper has the most excellent heat radiation property.

TABLE 6

| | | Classification | | | |
|---|---|---|---|---|---|
| | | Experimental Embodiment 3-1 | | Experimental Embodiment 3-2 | |
| Experiment No. | | 1 | 2 | 1 | 2 |
| 80° C. | SP1 | 80.0 | 80.0 | 80.0 | 80.0 |
| | SP2 | 70.5 | 70.6 | 70.6 | 70.4 |
| | SP3 | 68.0 | 68.0 | 68.0 | 67.5 |
| | SP4 | 62.9 | 63.8 | 64.2 | 63.5 |
| | SP5 | 55.5 | 55.7 | 56.2 | 55.6 |
| | SP6 | 48.4 | 48.6 | 49.4 | 48.5 |
| | SP7 | 42.9 | 42.7 | 43.4 | 42.6 |
| | SP8 | 38.5 | 38.1 | 39.1 | 38.0 |
| | SP9 | 35.5 | 34.7 | 35.7 | 34.5 |
| | SP10 | 32.9 | 32.5 | 33.5 | 32.4 |
| ΔT (SP2-SP10) | | 37.6 | 38.1 | 37.1 | 38.0 |
| ΔT (SP2-SP10) mean | | 37.9 | | 37.6 | |

TABLE 7

| | | Classification | | | |
|---|---|---|---|---|---|
| | | Experimental Embodiment 3-3 | | Experimental Embodiment 3-4 | |
| Experiment No. | | 1 | 2 | 1 | 2 |
| 80° C. | SP1 | 80.0 | 80.0 | 80.0 | 80.0 |
| | SP2 | 70.7 | 70.8 | 71.1 | 70.4 |
| | SP3 | 68.5 | 68.6 | 68.9 | 68.1 |
| | SP4 | 64.0 | 63.8 | 64.8 | 64.1 |
| | SP5 | 56.1 | 55.9 | 57.2 | 56.4 |
| | SP6 | 48.9 | 49.1 | 50.0 | 49.4 |
| | SP7 | 43.2 | 43.4 | 44.3 | 43.3 |
| | SP8 | 38.7 | 38.9 | 39.7 | 38.8 |
| | SP9 | 35.7 | 35.8 | 36.4 | 35.3 |
| | SP10 | 33.2 | 33.2 | 34.1 | 33.1 |
| ΔT (SP2-SP10) | | 37.5 | 37.6 | 37.0 | 37.3 |
| ΔT (SP2-SP10) mean | | 37.6 | | 37.2 | |

TABLE 8

| | Classification | | | |
|---|---|---|---|---|
| | Experimental Embodiment 3-5 | | Experimental Embodiment 3-6 | |
| Experiment No. | 1 | 2 | 1 | 2 |
| 80° C. SP1 | 80.0 | 80.0 | 80.0 | 80.0 |
| SP2 | 70.4 | 70.0 | 70.8 | 70.8 |
| SP3 | 68.1 | 67.7 | 68.9 | 68.7 |
| SP4 | 64.3 | 63.2 | 65.2 | 65.0 |
| SP5 | 57.0 | 55.4 | 57.7 | 57.5 |
| SP6 | 49.7 | 48.1 | 50.8 | 50.3 |
| SP7 | 43.9 | 42.3 | 45.0 | 44.5 |
| SP8 | 39.3 | 37.7 | 40.3 | 39.9 |
| SP9 | 36.0 | 34.4 | 36.7 | 36.5 |
| SP10 | 33.5 | 32.2 | 34.2 | 34.1 |
| ΔT (SP2-SP10) | 36.9 | 37.8 | 36.6 | 36.7 |
| ΔT (SP2-SP10) mean | 37.4 | | 36.7 | |

TABLE 9

| | Classification | | | |
|---|---|---|---|---|
| | Experimental Embodiment 3-7 | | Experimental Embodiment 3-8 | |
| Experiment No. | 1 | 2 | 1 | 2 |
| 80° C. SP1 | 80.0 | 80.0 | 80.0 | 80.0 |
| SP2 | 70.5 | 70.5 | 70.6 | 70.5 |
| SP3 | 68.0 | 68.0 | 68.3 | 68.2 |
| SP4 | 64.5 | 63.5 | 64.2 | 63.9 |
| SP5 | 57.0 | 56.7 | 56.7 | 56.3 |
| SP6 | 50.5 | 49.9 | 50.1 | 49.5 |
| SP7 | 44.6 | 44.5 | 44.6 | 43.7 |
| SP8 | 40.3 | 40.0 | 40.0 | 39.3 |
| SP9 | 36.8 | 36.7 | 36.7 | 36.2 |
| SP10 | 34.7 | 34.3 | 34.5 | 34.1 |
| ΔT (SP2-SP10) | 35.8 | 36.2 | 36.1 | 36.4 |
| ΔT (SP2-SP10) mean | 36.0 | | 36.3 | |

FIG. 13 is a view for explaining another method of measuring a heat radiation property of heat radiation thin films according to Experimental Embodiments 3-1 to 3-8 of the present invention.

Referring to FIG. 13, a heat source and specimens (heat radiation thin films according to Experimental Embodiments 3-1 to 3-8) were prepared as shown in FIG. 13 and a temperature thereof was measured in each area (Sp1-Sp13) as shown in the following Tables 10 to 33, while rotating the specimens through 0, 90, 180 and 270 degrees. Measurement of temperatures was performed twice with regard to each of the heat radiation thin films according to Experimental Embodiments 3-1 to 3-8, while changing a temperature condition of heat source to 50° C., 80° C. and 100° C., and 10 μm one-sided black PET tape was attached to a surface of the heat radiation thin films according to Experimental Embodiments 3-1 to 3-8.

As may be seen from the following Tables 10 to 33, it may be confirmed that a heat radiation effect is relatively high in case of using a rolled copper film. Further, it may be confirmed that a structure of Experimental Embodiment 3-7, that is, a structure of sequentially laminating an adhesion layer, a graphitic carbon layer and a metal film of roller copper has the most excellent heat radiation property.

TABLE 10

| Classification (1st experiment) | | Experimental Embodiment 3-1 | | Experimental Embodiment 3-2 | |
|---|---|---|---|---|---|
| Heat source | SP1 | 50.0 | max − min | 50.0 | max − min |
| 0° | SP2 | 46.8 | 11.8 | 46.8 | 12 |
| | SP3 | 41.8 | | 43 | |
| | SP4 | 35 | | 34.8 | |
| 90° Rotation | SP5 | 46.3 | 10.1 | 46.4 | 10.2 |
| | SP6 | 43.1 | | 41.2 | |
| | SP7 | 36.2 | | 36.2 | |
| 180° Rotation | SP8 | 46.8 | 11.2 | 46.7 | 12 |
| | SP9 | 43 | | 41.9 | |
| | SP10 | 35.6 | | 34.7 | |
| 270° Rotation | SP11 | 46.4 | 11.5 | 47 | 10.6 |
| | SP12 | 41.8 | | 42.7 | |
| | SP13 | 34.9 | | 36.4 | |
| Ave. | | | 11.2 | | 11.2 |

TABLE 11

| Classification (1st experiment) | | Experimental Embodiment 3-3 | | Experimental Embodiment 3-4 | |
|---|---|---|---|---|---|
| Heat source | SP1 | 50.0 | max − min | 50.0 | max − min |
| 0° | SP2 | 47.1 | 11.7 | 47.8 | 11.3 |
| | SP3 | 42.7 | | 43.3 | |
| | SP4 | 35.4 | | 36.5 | |
| 90° Rotation | SP5 | 45.7 | 11.3 | 46.5 | 12.4 |
| | SP6 | 41.6 | | 41.3 | |
| | SP7 | 34.4 | | 34.1 | |
| 180° Rotation | SP8 | 47 | 10.5 | 46.3 | 13.6 |
| | SP9 | 43.1 | | 39.5 | |
| | SP10 | 36.5 | | 32.7 | |
| 270° Rotation | SP11 | 45.4 | 11.7 | 46.2 | 10.4 |
| | SP12 | 39.9 | | 43.1 | |
| | SP13 | 33.7 | | 35.8 | |
| Ave. | | | 11.3 | | 11.9 |

TABLE 12

| Classification (1st experiment) | | Experimental Embodiment 3-5 | | Experimental Embodiment 3-6 | |
|---|---|---|---|---|---|
| Heat source | SP1 | 50.0 | max − min | 50.0 | max − min |
| 0° | SP2 | 47 | 12.3 | 46.9 | 13 |
| | SP3 | 41.3 | | 41.1 | |
| | SP4 | 34.7 | | 33.9 | |
| 90° Rotation | SP5 | 46.6 | 12.9 | 46.9 | 11.9 |
| | SP6 | 41.9 | | 41.8 | |
| | SP7 | 33.7 | | 35 | |
| 180° Rotation | SP8 | 46.8 | 10.5 | 46.7 | 10.3 |
| | SP9 | 42.3 | | 42.9 | |
| | SP10 | 36.3 | | 36.4 | |
| 270° Rotation | SP11 | 46.8 | 9.3 | 46.8 | 10.4 |
| | SP12 | 42.9 | | 42.2 | |
| | SP13 | 37.5 | | 36.4 | |
| Ave. | | | 11.3 | | 11.4 |

TABLE 13

| Classification (1st experiment) | | Experimental Embodiment 3-7 | | Experimental Embodiment 3-8 | |
|---|---|---|---|---|---|
| Heat source | SP1 | 50.0 | max − min | 50.0 | max − min |
| 0° | SP2 | 46.8 | 11.1 | 46.5 | 12.5 |
| | SP3 | 40.8 | | 41.3 | |
| | SP4 | 35.7 | | 34 | |

TABLE 13-continued

| Classification (1st experiment) | | Experimental Embodiment 3-7 | | Experimental Embodiment 3-8 | |
|---|---|---|---|---|---|
| Heat source | SP1 | 50.0 | max − min | 50.0 | max − min |
| 90° Rotation | SP5 | 46.6 | 11.1 | 46.5 | 11.2 |
| | SP6 | 41.9 | | 41.9 | |
| | SP7 | 35.5 | | 35.3 | |
| 180° Rotation | SP8 | 46.8 | 10.9 | 46 | 11 |
| | SP9 | 42.9 | | 42.2 | |
| | SP10 | 35.9 | | 35 | |
| 270° Rotation | SP11 | 46.2 | 10 | 46.5 | 9.5 |
| | SP12 | 41.8 | | 42.9 | |
| | SP13 | 36.2 | | 37 | |
| Ave. | | | 10.8 | | 11.1 |

TABLE 14

| Classification (2nd experiment) | | Experimental Embodiment 3-1 | | Experimental Embodiment 3-2 | |
|---|---|---|---|---|---|
| Heat source | SP1 | 50.0 | max − min | 50.0 | max − min |
| 0° | SP2 | 46.5 | 12.7 | 47.5 | 11.9 |
| | SP3 | 41.5 | | 43.2 | |
| | SP4 | 33.8 | | 35.6 | |
| 90° Rotation | SP5 | 46.9 | 10.3 | 45.9 | 12.9 |
| | SP6 | 43.3 | | 40.6 | |
| | SP7 | 36.6 | | 33 | |
| 180° Rotation | SP8 | 47 | 11.9 | 46.9 | 10.1 |
| | SP9 | 41.6 | | 43.3 | |
| | SP10 | 35.1 | | 36.8 | |
| 270° Rotation | SP11 | 46.9 | 10.9 | 46.6 | 11.1 |
| | SP12 | 43.3 | | 42.7 | |
| | SP13 | 36 | | 35.5 | |
| Ave. | | | 11.5 | | 11.5 |

TABLE 15

| Classification (2nd experiment) | | Experimental Embodiment 3-3 | | Experimental Embodiment 3-4 | |
|---|---|---|---|---|---|
| Heat source | SP1 | 50.0 | max − min | 50.0 | max − min |
| 0° | SP2 | 47.3 | 11 | 47.7 | 11.1 |
| | SP3 | 43.9 | | 43.8 | |
| | SP4 | 36.3 | | 37.6 | |
| 90° Rotation | SP5 | 45.9 | 10.8 | 48.6 | 11.2 |
| | SP6 | 41.7 | | 44 | |
| | SP7 | 35.1 | | 37.4 | |
| 180° Rotation | SP8 | 47.1 | 10.2 | 46.4 | 12.6 |
| | SP9 | 42.9 | | 41.3 | |
| | SP10 | 36.9 | | 33.8 | |
| 270° Rotation | SP11 | 47 | 13.4 | 46.7 | 11.2 |
| | SP12 | 40.7 | | 42.4 | |
| | SP13 | 33.6 | | 35.5 | |
| Ave. | | | 11.4 | | 11.5 |

TABLE 16

| Classification (2nd experiment) | | Experimental Embodiment 3-5 | | Experimental Embodiment 3-6 | |
|---|---|---|---|---|---|
| Heat source | SP1 | 50.0 | max − min | 50.0 | max − min |
| 0° | SP2 | 46.9 | 12.8 | 46.5 | 12.2 |
| | SP3 | 40.6 | | 41.6 | |
| | SP4 | 34.1 | | 34.3 | |
| 90° Rotation | SP5 | 45.9 | 13.9 | 46.3 | 10.1 |
| | SP6 | 39.6 | | 42.1 | |
| | SP7 | 32 | | 36.2 | |

TABLE 16-continued

| Classification (2nd experiment) | | Experimental Embodiment 3-5 | | Experimental Embodiment 3-6 | |
|---|---|---|---|---|---|
| Heat source | SP1 | 50.0 | max − min | 50.0 | max − min |
| 180° Rotation | SP8 | 46.4 | 10.3 | 47.9 | 13 |
| | SP9 | 42.9 | | 42.4 | |
| | SP10 | 36.1 | | 34.9 | |
| 270° Rotation | SP11 | 46 | 10.8 | 45.8 | 10.7 |
| | SP12 | 42.2 | | 41.2 | |
| | SP13 | 35.2 | | 35.1 | |
| Ave. | | | 12.0 | | 11.5 |

TABLE 17

| Classification (2nd experiment) | | Experimental Embodiment 3-7 | | Experimental Embodiment 3-8 | |
|---|---|---|---|---|---|
| Heat source | SP1 | 50.0 | max − min | 50.0 | max − min |
| 0° | SP2 | 46.5 | 11.9 | 48 | 15.2 |
| | SP3 | 42.4 | | 40.4 | |
| | SP4 | 34.6 | | 32.8 | |
| 90° Rotation | SP5 | 45.8 | 11.6 | 46.1 | 11.4 |
| | SP6 | 41.1 | | 40.9 | |
| | SP7 | 34.2 | | 34.7 | |
| 180° Rotation | SP8 | 46.8 | 11.7 | 46.9 | 10.7 |
| | SP9 | 41.6 | | 42.8 | |
| | SP10 | 35.1 | | 36.2 | |
| 270° Rotation | SP11 | 45.8 | 9.4 | 46 | 9.5 |
| | SP12 | 41.7 | | 41.9 | |
| | SP13 | 36.4 | | 36.5 | |
| Ave. | | | 11.2 | | 11.7 |

TABLE 18

| Classification (1st experiment) | | Experimental Embodiment 3-1 | | Experimental Embodiment 3-2 | |
|---|---|---|---|---|---|
| Heat source | SP1 | 80.0 | max − min | 80.0 | max − min |
| 0° | SP2 | 73.1 | 29.6 | 72.2 | 29.1 |
| | SP3 | 60.7 | | 61.1 | |
| | SP4 | 43.5 | | 43.1 | |
| 90° Rotation | SP5 | 71.3 | 27.0 | 72.0 | 26.8 |
| | SP6 | 59.3 | | 57.5 | |
| | SP7 | 44.3 | | 45.2 | |
| 180° Rotation | SP8 | 72.6 | 30.6 | 72.7 | 29.7 |
| | SP9 | 60.3 | | 60.0 | |
| | SP10 | 42.0 | | 43.0 | |
| 270° Rotation | SP11 | 68 | 25.6 | 72.9 | 28.4 |
| | SP12 | 59.2 | | 62.0 | |
| | SP13 | 42.4 | | 44.5 | |
| Ave. | | | 28.2 | | 28.5 |

TABLE 19

| Classification (1st experiment) | | Experimental Embodiment 3-3 | | Experimental Embodiment 3-4 | |
|---|---|---|---|---|---|
| Heat source | SP1 | 80.0 | max − min | 80.0 | max − min |
| 0° | SP2 | 73.8 | 27.5 | 71.6 | 25.5 |
| | SP3 | 62.8 | | 62.5 | |
| | SP4 | 46.3 | | 46.1 | |
| 90° Rotation | SP5 | 68.8 | 26.2 | 70.9 | 27.4 |
| | SP6 | 57.6 | | 58.5 | |
| | SP7 | 42.6 | | 43.5 | |
| 180° Rotation | SP8 | 72.9 | 28.7 | 72.0 | 33.4 |
| | SP9 | 61.7 | | 54.7 | |
| | SP10 | 44.2 | | 38.6 | |

TABLE 19-continued

| Classification (1st experiment) | | Experimental Embodiment 3-3 | | Experimental Embodiment 3-4 | |
|---|---|---|---|---|---|
| Heat source | SP1 | 80.0 | max − min | 80.0 | max − min |
| 270° Rotation | SP11 | 68.3 | 27.9 | 70.6 | 28.3 |
|  | SP12 | 55.2 |  | 60.8 |  |
|  | SP13 | 40.4 |  | 42.3 |  |
| Ave. |  |  | 27.6 |  | 28.7 |

TABLE 20

| Classification (1st experiment) | | Experimental Embodiment 3-5 | | Experimental Embodiment 3-6 | |
|---|---|---|---|---|---|
| Heat source | SP1 | 80.0 | max − min | 80.0 | max − min |
| 0° | SP2 | 73.2 | 30.5 | 73.1 | 30.4 |
|  | SP3 | 58.1 |  | 57.4 |  |
|  | SP4 | 42.7 |  | 42.7 |  |
| 90° Rotation | SP5 | 72.4 | 29.6 | 72.0 | 29.7 |
|  | SP6 | 59.1 |  | 57.9 |  |
|  | SP7 | 42.8 |  | 42.3 |  |
| 180° Rotation | SP8 | 72.7 | 29.4 | 72.7 | 28.9 |
|  | SP9 | 58.2 |  | 60.4 |  |
|  | SP10 | 43.3 |  | 43.8 |  |
| 270° Rotation | SP11 | 71.9 | 26.6 | 68.3 | 23.7 |
|  | SP12 | 59.6 |  | 58.6 |  |
|  | SP13 | 45.3 |  | 44.6 |  |
| Ave. |  |  | 29.0 |  | 28.2 |

TABLE 21

| Classification (1st experiment) | | Experimental Embodiment 3-7 | | Experimental Embodiment 3-8 | |
|---|---|---|---|---|---|
| Heat source | SP1 | 80.0 | max − min | 80.0 | max − min |
| 0° | SP2 | 73.1 | 28.1 | 71.7 | 28.2 |
|  | SP3 | 57.1 |  | 59.0 |  |
|  | SP4 | 45.0 |  | 43.5 |  |
| 90° Rotation | SP5 | 71.6 | 27.9 | 71.9 | 28.6 |
|  | SP6 | 58.3 |  | 58.6 |  |
|  | SP7 | 43.7 |  | 43.3 |  |
| 180° Rotation | SP8 | 72.0 | 26.5 | 69.7 | 27.2 |
|  | SP9 | 60.6 |  | 57.5 |  |
|  | SP10 | 45.5 |  | 42.5 |  |
| 270° Rotation | SP11 | 70.0 | 24.4 | 70.7 | 25.7 |
|  | SP12 | 60.0 |  | 59.3 |  |
|  | SP13 | 45.6 |  | 45.0 |  |
| Ave. |  |  | 26.7 |  | 27.4 |

TABLE 22

| Classification (2nd experiment) | | Experimental Embodiment 3-1 | | Experimental Embodiment 3-2 | |
|---|---|---|---|---|---|
| Heat source | SP1 | 80.0 | max − min | 80.0 | max − min |
| 0° | SP2 | 71.9 | 32.3 | 74.0 | 30.6 |
|  | SP3 | 58.4 |  | 61.0 |  |
|  | SP4 | 39.6 |  | 43.4 |  |
| 90° Rotation | SP5 | 72.9 | 26.5 | 69.6 | 31.0 |
|  | SP6 | 61.5 |  | 54.8 |  |
|  | SP7 | 46.4 |  | 38.6 |  |
| 180° Rotation | SP8 | 68.7 | 26.0 | 72.8 | 31.0 |
|  | SP9 | 58.7 |  | 57.5 |  |
|  | SP10 | 42.7 |  | 41.8 |  |
| 270° Rotation | SP11 | 70.9 | 31.6 | 71.3 | 27.1 |
|  | SP12 | 57.0 |  | 59.7 |  |
|  | SP13 | 39.3 |  | 44.2 |  |
| Ave. |  |  | 29.1 |  | 29.9 |

TABLE 23

| Classification (2nd experiment) | | Experimental Embodiment 3-3 | | Experimental Embodiment 3-4 | |
|---|---|---|---|---|---|
| Heat source | SP1 | 80.0 | max − min | 80.0 | max − min |
| 0° | SP2 | 73.4 | 31.5 | 73.1 | 26.4 |
|  | SP3 | 59.6 |  | 63.4 |  |
|  | SP4 | 41.9 |  | 46.7 |  |
| 90° Rotation | SP5 | 69.9 | 27.3 | 72.4 | 31.1 |
|  | SP6 | 57.5 |  | 57.0 |  |
|  | SP7 | 42.6 |  | 41.3 |  |
| 180° Rotation | SP8 | 72.3 | 26.6 | 71.0 | 30.5 |
|  | SP9 | 60.4 |  | 57.2 |  |
|  | SP10 | 45.7 |  | 40.5 |  |
| 270° Rotation | SP11 | 71.6 | 31.1 | 73.0 | 30.7 |
|  | SP12 | 55.6 |  | 57.7 |  |
|  | SP13 | 40.5 |  | 42.3 |  |
| Ave. |  |  | 29.1 |  | 29.7 |

TABLE 24

| Classification (2nd experiment) | | Experimental Embodiment 3-5 | | Experimental Embodiment 3-6 | |
|---|---|---|---|---|---|
| Heat source | SP1 | 80.0 | max − min | 80.0 | max − min |
| 0° | SP2 | 73.0 | 30.2 | 71.6 | 29.9 |
|  | SP3 | 58.2 |  | 58.5 |  |
|  | SP4 | 42.8 |  | 41.7 |  |
| 90° Rotation | SP5 | 71.6 | 27.9 | 68.3 | 24.3 |
|  | SP6 | 59.0 |  | 60.1 |  |
|  | SP7 | 43.7 |  | 44.0 |  |
| 180° Rotation | SP8 | 70.7 | 29.5 | 75.1 | 32.0 |
|  | SP9 | 58.7 |  | 59.8 |  |
|  | SP10 | 41.2 |  | 43.1 |  |
| 270° Rotation | SP11 | 71.1 | 27.7 | 70.8 | 27.3 |
|  | SP12 | 60.6 |  | 59.9 |  |
|  | SP13 | 43.4 |  | 43.5 |  |
| Ave. |  |  | 28.8 |  | 28.4 |

TABLE 25

| Classification (2nd experiment) | | Experimental Embodiment 3-7 | | Experimental Embodiment 3-8 | |
|---|---|---|---|---|---|
| Heat source | SP1 | 80.0 | max − min | 80.0 | max − min |
| 0° | SP2 | 71.4 | 26.2 | 75.8 | 32.0 |
|  | SP3 | 60.8 |  | 60.3 |  |
|  | SP4 | 45.2 |  | 43.8 |  |
| 90° Rotation | SP5 | 69.0 | 27.2 | 71.5 | 28.1 |
|  | SP6 | 56.3 |  | 57.9 |  |
|  | SP7 | 41.8 |  | 43.4 |  |
| 180° Rotation | SP8 | 71.6 | 28.0 | 72.4 | 26.7 |
|  | SP9 | 59.7 |  | 61.8 |  |
|  | SP10 | 43.6 |  | 45.7 |  |
| 270° Rotation | SP11 | 68.7 | 23.0 | 69.3 | 28.3 |
|  | SP12 | 58.5 |  | 55.8 |  |
|  | SP13 | 45.7 |  | 41.0 |  |
| Ave. |  |  | 27.1 |  | 28.8 |

TABLE 26

| Classification (1st experiment) | | Experimental Embodiment 3-1 | | Experimental Embodiment 3-2 | |
|---|---|---|---|---|---|
| Heat source | SP1 | 100.0 | max − min | 100.0 | max − min |
| 0° | SP2 | 90.5 | 41.3 | 89.4 | 40.4 |
|  | SP3 | 73.6 |  | 73.2 |  |
|  | SP4 | 49.2 |  | 49.0 |  |

TABLE 26-continued

| Classification (1st experiment) | | Experimental Embodiment 3-1 | | Experimental Embodiment 3-2 | |
|---|---|---|---|---|---|
| Heat source | SP1 | 100.0 | max − min | 100.0 | max − min |
| 90° Rotation | SP5 | 88.6 | 39.5 | 89.0 | 38.4 |
| | SP6 | 71.1 | | 68.2 | |
| | SP7 | 49.1 | | 50.6 | |
| 180° Rotation | SP8 | 90.3 | 42.1 | 91.1 | 41.8 |
| | SP9 | 73.7 | | 73.6 | |
| | SP10 | 48.2 | | 49.3 | |
| 270° Rotation | SP11 | 88.0 | 39.0 | 90.9 | 41.2 |
| | SP12 | 72.4 | | 74.1 | |
| | SP13 | 49.0 | | 49.7 | |
| Ave. | | | 40.5 | | 40.5 |

TABLE 27

| Classification (1st experiment) | | Experimental Embodiment 3-3 | | Experimental Embodiment 3-4 | |
|---|---|---|---|---|---|
| Heat source | SP1 | 100.0 | max − min | 100.0 | max − min |
| 0° | SP2 | 91.9 | 38.9 | 92.9 | 39.9 |
| | SP3 | 77.4 | | 78.3 | |
| | SP4 | 53.0 | | 53.0 | |
| 90° Rotation | SP5 | 84.4 | 37.0 | 87.8 | 39.5 |
| | SP6 | 69.1 | | 70.0 | |
| | SP7 | 47.4 | | 48.3 | |
| 180° Rotation | SP8 | 87.8 | 39.0 | 87.3 | 44.3 |
| | SP9 | 72.4 | | 65.9 | |
| | SP10 | 48.8 | | 43.0 | |
| 270° Rotation | SP11 | 84.1 | 39.2 | 87.8 | 38.6 |
| | SP12 | 66.0 | | 75.0 | |
| | SP13 | 44.9 | | 49.2 | |
| Ave. | | | 38.5 | | 40.6 |

TABLE 28

| Classification (1st experiment) | | Experimental Embodiment 3-5 | | Experimental Embodiment 3-6 | |
|---|---|---|---|---|---|
| Heat source | SP1 | 100.0 | max − min | 100.0 | max − min |
| 0° | SP2 | 89.1 | 40.3 | 86.8 | 37.3 |
| | SP3 | 67.9 | | 69.3 | |
| | SP4 | 48.8 | | 49.5 | |
| 90° Rotation | SP5 | 89.7 | 41.9 | 89.8 | 42.5 |
| | SP6 | 69.8 | | 72.0 | |
| | SP7 | 47.8 | | 47.3 | |
| 180° Rotation | SP8 | 90.8 | 39.5 | 90.7 | 41.3 |
| | SP9 | 72.0 | | 73.2 | |
| | SP10 | 51.3 | | 49.4 | |
| 270° Rotation | SP11 | 89.3 | 37.9 | 87.0 | 36.0 |
| | SP12 | 71.7 | | 71.1 | |
| | SP13 | 51.4 | | 51.0 | |
| Ave. | | | 39.9 | | 39.3 |

TABLE 29

| Classification (1st experiment) | | Experimental Embodiment 3-7 | | Experimental Embodiment 3-8 | |
|---|---|---|---|---|---|
| Heat source | SP1 | 100.0 | max − min | 100.0 | max − min |
| 0° | SP2 | 89.9 | 38.9 | 89.9 | 39.6 |
| | SP3 | 69.0 | | 72.1 | |
| | SP4 | 51.0 | | 50.3 | |
| 90° Rotation | SP5 | 88.3 | 38.3 | 89.1 | 39.3 |
| | SP6 | 72.5 | | 70.8 | |
| | SP7 | 50.0 | | 49.8 | |

TABLE 29-continued

| Classification (1st experiment) | | Experimental Embodiment 3-7 | | Experimental Embodiment 3-8 | |
|---|---|---|---|---|---|
| Heat source | SP1 | 100.0 | max − min | 100.0 | max − min |
| 180° Rotation | SP8 | 88.5 | 37.5 | 90.2 | 38.1 |
| | SP9 | 73.3 | | 75.0 | |
| | SP10 | 51.0 | | 52.1 | |
| 270° Rotation | SP11 | 83.8 | 31.5 | 87.3 | 33.8 |
| | SP12 | 68.2 | | 72.8 | |
| | SP13 | 52.3 | | 53.5 | |
| Ave. | | | 36.6 | | 37.7 |

TABLE 30

| Classification (2nd experiment) | | Experimental Embodiment 3-1 | | Experimental Embodiment 3-2 | |
|---|---|---|---|---|---|
| Heat source | SP1 | 100.0 | max − min | 100.0 | max − min |
| 0° | SP2 | 89.3 | 43.2 | 92.5 | 42.4 |
| | SP3 | 71.8 | | 74.1 | |
| | SP4 | 46.1 | | 50.1 | |
| 90° Rotation | SP5 | 90.5 | 38.5 | 86.5 | 42.5 |
| | SP6 | 73.4 | | 67.2 | |
| | SP7 | 52.0 | | 44.0 | |
| 180° Rotation | SP8 | 89.8 | 40.7 | 90.4 | 41.2 |
| | SP9 | 70.4 | | 70.9 | |
| | SP10 | 49.1 | | 49.2 | |
| 270° Rotation | SP11 | 88.9 | 42.2 | 88.3 | 39.1 |
| | SP12 | 72.0 | | 71.0 | |
| | SP13 | 46.7 | | 49.2 | |
| Ave. | | | 41.2 | | 41.3 |

TABLE 31

| Classification (2nd experiment) | | Experimental Embodiment 3-3 | | Experimental Embodiment 3-4 | |
|---|---|---|---|---|---|
| Heat source | SP1 | 100.0 | max − min | 100.0 | max − min |
| 0° | SP2 | 90.8 | 40.4 | 90.7 | 36.4 |
| | SP3 | 74.2 | | 77.3 | |
| | SP4 | 50.4 | | 54.3 | |
| 90° Rotation | SP5 | 87.2 | 37.5 | 89.9 | 40.8 |
| | SP6 | 71.4 | | 72.2 | |
| | SP7 | 49.7 | | 49.1 | |
| 180° Rotation | SP8 | 89.8 | 37.9 | 86.5 | 42.5 |
| | SP9 | 72.0 | | 67.2 | |
| | SP10 | 51.9 | | 44.0 | |
| 270° Rotation | SP11 | 89.2 | 41.6 | 85.7 | 36.4 |
| | SP12 | 69.4 | | 71.7 | |
| | SP13 | 47.6 | | 49.3 | |
| Ave. | | | 39.4 | | 39.0 |

TABLE 32

| Classification (2nd experiment) | | Experimental Embodiment 3-5 | | Experimental Embodiment 3-6 | |
|---|---|---|---|---|---|
| Heat source | SP1 | 100.0 | max − min | 100.0 | max − min |
| 0° | SP2 | 92.6 | 40.1 | 89.0 | 41.4 |
| | SP3 | 78.4 | | 72.5 | |
| | SP4 | 52.5 | | 47.6 | |
| 90° Rotation | SP5 | 89.2 | 39.1 | 85.3 | 35.2 |
| | SP6 | 71.7 | | 70.7 | |
| | SP7 | 50.1 | | 50.1 | |

TABLE 32-continued

| Classification (2nd experiment) | | Experimental Embodiment 3-5 | | Experimental Embodiment 3-6 | |
|---|---|---|---|---|---|
| Heat source | SP1 | 100.0 | max − min | 100.0 | max − min |
| 180° Rotation | SP8 | 88.5 | 39.2 | 93.7 | 43.5 |
|  | SP9 | 74.1 |  | 73.7 |  |
|  | SP10 | 49.3 |  | 50.2 |  |
| 270° Rotation | SP11 | 87.9 | 37.0 | 87.7 | 38.7 |
|  | SP12 | 74.5 |  | 72.4 |  |
|  | SP13 | 50.9 |  | 49.0 |  |
| Ave. | | | 38.9 | | 39.7 |

TABLE 33

| Classification (2nd experiment) | | Experimental Embodiment 3-7 | | Experimental Embodiment 3-8 | |
|---|---|---|---|---|---|
| Heat source | SP1 | 100.0 | max − min | 100.0 | max − min |
| 0° | SP2 | 88.8 | 37.3 | 94.6 | 44.6 |
|  | SP3 | 74.3 |  | 73.5 |  |
|  | SP4 | 52.5 |  | 50.0 |  |
| 90° Rotation | SP5 | 86.3 | 37.7 | 88.6 | 39.1 |
|  | SP6 | 70.3 |  | 70.1 |  |
|  | SP7 | 48.6 |  | 49.5 |  |
| 180° Rotation | SP8 | 88.9 | 39.0 | 87.3 | 36.9 |
|  | SP9 | 72.1 |  | 70.9 |  |
|  | SP10 | 49.9 |  | 50.4 |  |
| 270° Rotation | SP11 | 89.9 | 37.8 | 87.3 | 37.4 |
|  | SP12 | 74.1 |  | 70.6 |  |
|  | SP13 | 52.1 |  | 49.9 |  |
| Ave. | | | 37.7 | | 39.5 |

FIG. 14 is a view showing a structure of heat radiation thin films according to Experimental Embodiments 4-1 to 4-12 of the present invention.

Referring to FIG. 14, the heat radiation thin films according to Experimental Embodiments 4-1 to 4-12 were prepared as shown in FIG. 14. In FIG. 14, GB means a carbon layer which is fabricated by using graphite powder and binders as described with reference to FIGS. 9 and 10, GCL refers to a graphitic carbon layer as described with reference to FIG. 8, and PSA stands for an adhesion layer.

A maximum saturation temperature and a temperature over time after mode off were measured on the back of a mobile phone in a video recording mode and a game mode (Lineage Red Knights version). Before measurement, Wi-fi, GPS, Bluetooth and Data network functions were turned off, all the data stored in the mobile phone were deleted, and a measurement temperature was set at about 24° C., and then measurement was performed in a state in which a battery charging rate was at least 80%.

The results of measurement are as shown in the following Tables 34 and 35. As may be seen from Tables 34 and 35, it may be confirmed that the heat radiation thin film having a graphitic carbon layer (GCL) has the most excellent heat radiation effect in the video mode and the game mode according to Experimental Embodiments 4-4, 4-8, 4-11 and 4-12.

TABLE 34

| Classification | Video mode On | | | |
|---|---|---|---|---|
|  | Saturation Temp. | −5 min Temp. | −10 min Temp. | −15 min Temp. |
| Experimental Embodiment 4-1 | 46.1 | 36.3 | 34.6 | 33.3 |
| Experimental Embodiment 4-2 | 46.2 | 35.6 | 33.7 | 32.3 |
| Experimental Embodiment 4-3 | 46.0 | 35.9 | 33.9 | 32.7 |
| Experimental Embodiment 4-4 | 46.0 | 35.7 | 33.9 | 31.5 |
| Experimental Embodiment 4-5 | 46.2 | 35.9 | 34.1 | 33.7 |
| Experimental Embodiment 4-6 | 46.3 | 36.1 | 33.5 | 32.5 |
| Experimental Embodiment 4-7 | 46.1 | 35.6 | 33.6 | 32.3 |
| Experimental Embodiment 4-8 | 45.9 | 35.3 | 32.7 | 31.6 |
| Experimental Embodiment 4-9 | 46.4 | 35.7 | 33.4 | 32.6 |
| Experimental Embodiment 4-10 | 46.2 | 35.4 | 33.1 | 32.3 |
| Experimental Embodiment 4-11 | 45.9 | 35.6 | 33.5 | 31.6 |
| Experimental Embodiment 4-12 | 46.0 | 36.3 | 33.9 | 31.7 |

TABLE 35

| Classification | Game mode On | | | |
|---|---|---|---|---|
|  | Saturation Temp. | −5 min Temp. | −10 min Temp. | −15 min Temp. |
| Experimental Embodiment 4-1 | 42.2 | 35.2 | 32.6 | 31.6 |
| Experimental Embodiment 4-2 | 42.5 | 36.0 | 34.2 | 32.8 |
| Experimental Embodiment 4-3 | 41.7 | 35.3 | 32.2 | 31.5 |
| Experimental Embodiment 4-4 | 41.7 | 35.2 | 31.3 | 30.6 |
| Experimental Embodiment 4-5 | 42.4 | 35.2 | 33.0 | 32.2 |
| Experimental Embodiment 4-6 | 42.5 | 34.8 | 32.7 | 32.1 |
| Experimental Embodiment 4-7 | 42.3 | 35.1 | 33.4 | 32.1 |
| Experimental Embodiment 4-8 | 42.2 | 34.7 | 32.4 | 30.6 |
| Experimental Embodiment 4-9 | 42.4 | 34.7 | 32.9 | 32.2 |
| Experimental Embodiment 4-10 | 42.4 | 36.1 | 34.1 | 32.3 |

TABLE 35-continued

| | Game mode On | | | |
|---|---|---|---|---|
| Classification | Saturation Temp. | −5 min Temp. | −10 min Temp. | −15 min Temp. |
| Experimental Embodiment 4-11 | 42.1 | 34.9 | 33.3 | 30.7 |
| Experimental Embodiment 4-12 | 42.1 | 34.8 | 32.3 | 30.8 |

In a structure of the heat radiation thin film according to Experimental Embodiment 4-4, a heat radiation effect depending on a thickness of the carbon layer (GB) using graphite powder and binders was measured as shown in the following Table 36. As may be seen from Table 36, it may be confirmed in the structure of the heat radiation thin film according to Experimental Embodiment 4-4 that a heat radiation effect is most excellent in the case where the thickness of the carbon layer (GB) using graphite powder and binders is 5-7 μm.

TABLE 36

| | Video mode On | | | |
|---|---|---|---|---|
| GB thickness | Saturation Temp. | −5 min Temp. | −10 min Temp. | −15 min Temp. |
| 3 μm | 45.9 | 36.0 | 34.3 | 32.3 |
| 5 μm | 46.0 | 35.7 | 33.9 | 31.5 |
| 7 μm | 46.1 | 35.9 | 33.7 | 31.6 |
| 10 μm | 46.2 | 36.2 | 34.2 | 32.1 |

In a structure of the heat radiation thin film according to Experimental Embodiment 4-8, a heat radiation effect was measured depending on a thickness of the carbon layer (GB) using graphite powder and binders as shown in the following Table 37. As may be seen from Table 32, it may be confirmed in the structure of the heat radiation thin film according to Experimental Embodiment 4-8 that the heat radiation effect is most excellent in the case where the thickness of the carbon layer (GB) using graphite powder and binders is 5 μm.

TABLE 37

| | Video mode On | | | |
|---|---|---|---|---|
| GB thickness | Saturation Temp. | −5 min Temp. | −10 min Temp. | −15 min Temp. |
| 3 μm | 46.2 | 36.3 | 34.4 | 32.3 |
| 5 μm | 45.9 | 35.3 | 32.7 | 31.6 |
| 7 μm | 46.3 | 36.1 | 34.2 | 32.4 |
| 10 μm | 46.3 | 36.2 | 34.6 | 32.4 |

A heat radiation property was evaluated while controlling a temperature of heat treatment depending on a type of substrates.

Fabricating of High Heat Radiation Thin Films According to Experimental Embodiments 5-1 to 5-3

A 30 μm aluminum substrate was prepared as a metal substrate. Carbon ions were provided onto the aluminum substrate to form a preliminary carbon layer, and then a heat treatment process was performed at 400° C. Specifically, the heat treatment process was performed for 30 minutes while raising a temperature at 15° C./min. According to Experimental Embodiments 5-1 to 5-3 of the present invention, a heat radiation thin film with a 2.5 nm graphitic carbon layer, a 5 nm graphitic carbon layer and a 10 nm graphitic carbon layer formed on the aluminum substrate was fabricated.

Thin Film According to Comparative Embodiment 3-1

A 30 μm aluminum substrate was prepared as a Comparative Embodiment of heat radiation thin films according to Experimental Embodiments 5-1 to 5-3 of the present invention as described in detail above.

Thin Film According to Comparative Embodiment 3-2

A 30 μm aluminum substrate was prepared as a Comparative Embodiment of heat radiation thin films according to Experimental Embodiments 5-1 to 5-3 of the present invention as described in detail above, and carbon ions were provided onto the aluminum substrate to form a preliminary carbon layer with a thickness of 5 nm in the same way as the method according to Experimental Embodiments 5-1 to 5-3 as described in detail above. After that, the heat treatment process was not performed unlike the method according to Experimental Embodiments 5-1 to 5-3 as described in detail above.

The heat radiation thin films according to Experimental Embodiments 5-1 to 5-3 and the thin films according to Comparative Embodiments 3-1 and 3-2 as described in detail above may be summarized as shown in the following Table 38.

TABLE 38

| Classification | Metal substrate | Thickness of carbon layer | Temperature of heat treatment | Thermal conductivity |
|---|---|---|---|---|
| Experimental Embodiment 5-1 | Al | 2.5 nm | 400° C. | 339 W/mK |
| Experimental Embodiment 5-2 | | 5 nm | 400° C. | 384 W/mK |
| Experimental Embodiment 5-3 | | 10 nm | 400° C. | 297 W/mK |
| Comparative Embodiment 3-1 | | — | — | 221 W/mK |
| Comparative Embodiment 3-2 | | 5 nm | — | 236 W/mK |

FIG. 15 is a graph measuring a thermal conductivity of heat radiation thin films according to Experimental Embodiments 5-1 to 5-3 of the present invention and thin films according to Comparative Embodiments 3-1 and 3-2 of the present invention.

Referring to FIG. 15, a measurement was made about the thermal conductivity of heat radiation thin films according to Experimental Embodiments 5-1 to 5-3 and thin films according to Comparative Embodiments 3-1 and 3-2 as described in detail above. Specifically, the measurement was made with an LFA equipment of NETZSH about the thermal conductivity of the heat radiation thin films according to Experimental Embodiments 5-1 to 5-3 and the thin films according to Comparative Embodiments 3-1 and 3-2 as described in detail above. The results of measurement are summarized as shown in the following Table 39 and FIG. 16.

TABLE 39

| Classification | Thickness of carbon layer | Thermal conductivity |
|---|---|---|
| Experimental Embodiment 5-1 | 2.5 nm | 339 W/mK |
| Experimental Embodiment 5-2 | 5 nm | 384 W/mK |
| Experimental Embodiment 5-3 | 10 nm | 297 W/mK |
| Comparative Embodiment 3-1 | — | 221 W/mK |
| Comparative Embodiment 3-2 | 5 nm | 236 W/mK |

As may be seen from FIG. 15 and Table 39, it may be confirmed that the heat radiation thin films according to Experimental Embodiments 5-1 to 5-3 have a remarkably high thermal conductivity, compared to the aluminum thin film according to Comparative Embodiment 3-1 without a graphitic carbon layer formed thereon.

Further, in case of the thin film according to Comparative Embodiment 3-2 without the heat treatment process performed after forming the preliminary carbon layer onto the aluminum substrate, it was measured that a thermal conductivity thereof is slightly higher than that of the aluminum thin film according to Comparative Embodiment 3-1 without the preliminary carbon layer and the graphitic carbon layer formed thereon. However, it may be confirmed that the thermal conductivity thereof is remarkably lower than that of the heat radiation thin film according to Experimental Embodiments 5-1 to 5-3 with the carbon layer formed thereon by performing the heat treatment process.

Consequently, it may be confirmed that providing the carbon ions onto the aluminum substrate to form the preliminary carbon layer and performing the heat treatment process is an efficient method for improving the thermal conductivity of thin films.

Further, it may be confirmed that the thermal conductivity is controlled depending on the thickness of the graphitic carbon layer, when comparing Examples 5-1 to 5-3 with each other. Specifically, in the case where the thickness of the graphitic carbon layer is 5 nm according to Experimental Embodiment 5-2, it may be confirmed that the thermal conductivity thereof is remarkably higher than in the case where the thickness of the graphitic carbon layer is 2.5 nm according to Experimental Embodiment 5-1 and in the case where the thickness of the graphitic carbon layer is 10 nm according to Experimental Embodiment 5-3. Specifically, in the case of the heat radiation thin film according to Experimental Embodiment 5-2, it may be confirmed that the thermal conductivity thereof is about at least 13% higher than that of the heat radiation thin film according to Experimental Embodiment 5-1 and the thermal conductivity thereof is about at least 29% higher than that of the heat radiation thin film according to Experimental Embodiment 3-3.

Consequently, it may be confirmed that controlling the thickness of the graphitic carbon layer formed on the metal substrate to be more than 2.5 nm and less than 10 nm is an efficient method for improving the thermal conductivity of thin films.

FIG. 16 is a graph measuring a thermal conductivity of a heat radiation thin film according to Experimental Embodiment 5-3 of the present invention depending on a temperature of heat treatment.

Referring to FIG. 16, the carbon layer with a thickness of 10 nm was formed on the aluminum substrate according to Experimental Embodiment 5-3 as described in detail above, in which the temperature of heat treatment was controlled to be 300° C., 350° C., 400° C., 450° C., 500° C. and 600° C. The thermal conductivity of the high heat radiation thin films with a different temperature of heat treatment was measured with an LFA equipment of NETZSH. The results of measurement are summarized as shown in the following Table 40 and FIG. 17.

TABLE 40

| Classification | Metal substrate | Thickness of carbon layer | Temperature of heat treatment | Thermal conductivity |
|---|---|---|---|---|
| Experimental Embodiment 5-3 | Al | 10 nm | 300° C. | 245 W/mK |
| | | | 350° C. | 256 W/mK |
| | | | 400° C. | 297 W/mK |
| | | | 450° C. | 290 W/mK |
| | | | 500° C. | 241 W/mK |
| | | | 600° C. | 203 W/mK |

As may be seen from FIG. 16 and Table 40, it may be confirmed that the thermal conductivity is controlled depending on the temperature of heat treatment. Specifically, in the case where the temperature of heat treatment is more than 350° C. and less than 500° C., it may be confirmed that the thermal conductivity thereof is remarkably higher than in the case where the temperature of heat treatment is 300-350° C. and in the case where the temperature of heat treatment is 500-600° C. Specifically, in the case where at the temperature of heat treatment is 400° C., it was measured that the thermal conductivity thereof is highest as 297 W/mk and it was measured that the thermal conductivity thereof is about 21% higher than in the case where the temperature of heat treatment is 300° C.; about 16% higher than in the case where the temperature of heat treatment is 350° C.; about 23% higher than in the case where the temperature of heat treatment is 500° C.; and about 46% higher than in the case where the temperature of heat treatment is 600° C.

Consequently, with regard to the heat treatment process for fabricating the carbon layer after forming the preliminary carbon layer on the aluminum substrate, it may be confirmed that adjusting the temperature thereof to be more than 350° C. and less than 500° C. is an efficient method for improving the thermal conductivity of thin films.

Fabricating of High Heat Radiation Thin Films According to Experimental Embodiments 6-1 to 4-6

A 35 μm copper substrate was prepared as a metal substrate. Carbon ions were provided onto the copper substrate to form a preliminary carbon layer, and then a heat treatment process was performed while varying a temperature. Specifically, a heat treatment process was performed for 30 minutes at 400° C., 500° C., 600° C., 700° C., 800° C. and 900° C. while raising a temperature at 15° C./min, and thus a heat radiation thin film with a 5 nm-thick graphitic carbon layer formed thereon was fabricated according to Experimental Embodiments 6-1 to 6-6 of the present invention.

Thin Film According to Comparative Embodiment 4-1

A 35 μm copper substrate was prepared as a comparative embodiment of the heat radiation thin films according to Experimental Embodiments 6-1 to 6-6 of the present invention as described in detail above.

Thin Film According to Comparative Embodiment 4-2

A 35 μm copper substrate was prepared as a comparative embodiment of the high heat radiation thin films according to Experimental Embodiments 6-1 to 6-6 of the present invention as described in detail above, and carbon ions were provided onto the copper substrate to form a preliminary carbon layer with a thickness of 5 nm in the same way as the method according to Experimental Embodiments 6-1 to 6-6 as described in detail above. After that, the heat treatment process was not performed unlike the method according to Experimental Embodiments 6-1 to 6-6 as described in detail above.

The high heat radiation thin films according to Experimental Embodiments 6-1 to 6-6 and the thin films according to Comparative Embodiments 6-1 and 6-2 as described in detail above may be summarized as shown in the following Table 41.

TABLE 41

| Classification | Metal substrate | Thickness of carbon layer | Temperature of heat treatment |
|---|---|---|---|
| Experimental Embodiment 6-1 | Cu | 5 nm | 400° C. |
| Experimental Embodiment 6-2 | | | 500° C. |
| Experimental Embodiment 6-3 | | | 600° C. |
| Experimental Embodiment 6-4 | | | 700° C. |
| Experimental Embodiment 6-5 | | | 800° C. |
| Experimental Embodiment 6-6 | | | 900° C. |
| Comparative Embodiment 4-1 | | — | — |
| Comparative Embodiment 4-2 | | 5 nm | — |

FIG. 17 is a graph measuring a thermal conductivity of high heat radiation thin films according to Experimental Embodiments 6-1 to 6-6 of the present invention.

Referring to FIG. 17, a measurement was made with an LFA equipment of NETZSH about the thermal conductivity of high heat radiation thin films according to Experimental Embodiments 6-1 to 6-6 and the thin films according to Comparative Embodiments 4-1 and 4-2 as described in detail above. The results of measurement are summarized as shown in the following Table 42 and FIG. 17.

TABLE 42

| Classification | Temperature of heat treatment | Thermal conductivity |
|---|---|---|
| Experimental Embodiment 6-1 | 400° C. | 327 W/mK |
| Experimental Embodiment 6-2 | 500° C. | 339 W/mK |
| Experimental Embodiment 6-3 | 600° C. | 409 W/mK |
| Experimental Embodiment 6-4 | 700° C. | 435 W/mK |
| Experimental Embodiment 6-5 | 800° C. | 460 W/mK |
| Experimental Embodiment 6-6 | 900° C. | 384 W/mK |
| Comparative Embodiment 4-1 | — | 298 W/mK |
| Comparative Embodiment 4-2 | — | 313 W/mK |

As may be seen from FIG. 17 and Table 42, it may be confirmed that the heat radiation thin films according to Experimental Embodiments 6-1 to 6-6 have a remarkably high thermal conductivity, compared to the copper thin film according to Comparative Embodiment 4-1 without a graphitic carbon layer formed thereon.

Further, in case of the thin film according to Comparative Embodiment 4-2 without the heat treatment process performed after forming the preliminary carbon layer onto the copper substrate, it was measured that a thermal conductivity thereof is slightly higher than that of the copper thin film according to Comparative Embodiment 4-1 without the preliminary carbon layer and the graphitic carbon layer formed thereon. However, it may be confirmed that the thermal conductivity thereof is remarkably lower than that of the heat radiation thin films according to Experimental Embodiments 6-1 to 6-6 with the graphitic carbon layer formed thereon by performing the heat treatment process.

Consequently, it may be confirmed that providing the carbon ions onto the copper substrate to form the preliminary carbon layer and performing the heat treatment process is an efficient method for improving the thermal conductivity of thin films.

Further, it may be confirmed that the thermal conductivity is controlled depending on the temperature of heat treatment. Specifically, in the case where the temperature of heat treatment is more than 500° C. and less than 900° C., it may be confirmed that the thermal conductivity thereof is remarkably higher than in the case where the temperature of heat treatment is 400-500° C. and in the case where the temperature of heat treatment is 900° C. Specifically, in the case where the temperature of heat treatment is 800° C., it was measured that the thermal conductivity thereof is highest as 460 W/mk and it was measured that the thermal conductivity thereof is about 41% higher than in the case where the temperature of heat treatment is 400° C.; about 36% higher than in the case where the temperature of heat treatment is 500° C.; and about 20% higher than in the case where the temperature of heat treatment is 900° C.

Consequently, with regard to the heat treatment process for fabricating the carbon layer after forming the preliminary carbon layer on the aluminum substrate, it may be confirmed that adjusting the temperature thereof to be more than 350° C. and less than 500° C. is an efficient method for improving the thermal conductivity of thin films.

Further, referring to Tables 40 and 42, it may be confirmed that a range of temperatures of heat treatment having a maximum value of thermal conductivity varies depending on a type of metal substrates used therein. In other words, it may be confirmed that controlling the temperature of heat treatment depending the type of metal substrates is an effective method for improving the thermal conductivity.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

What is claimed is:

1. A method of fabricating a high heat radiation thin film, the method comprising:
    preparing a copper substrate having a first surface and a second surface that is opposite the first surface;
    forming a preliminary carbon layer by providing carbon atoms onto the first surface of the copper substrate;
    rearranging the carbon atoms to form a first carbon layer that includes graphene, wherein the first carbon layer that includes graphene is formed on the first surface of the copper substrate, wherein the first carbon layer that includes graphene is formed by performing a heat treatment on the first copper substrate and the preliminary carbon layer at between 600° C. and 800° C., wherein the first carbon layer that includes graphene is formed under an oxygen-free and hydrogen-free atmosphere, and wherein the carbon layer that includes graphene has a thermal conductivity that is (i) higher than a thermal conductivity of the preliminary carbon layer and (ii) more than 409 W/mK;
    after forming the first carbon layer that includes graphene, forming a second carbon layer on the second surface of the copper substrate, wherein the second carbon layer is formed by preparing a carbon coating material comprising graphite powder and a binder, and applying the carbon coating material to the second surface of the copper substrate, and wherein the second carbon layer is thicker than the first carbon layer that includes graphene; and
    forming a pressure sensitive adhesion film on the second carbon layer,
    wherein a thickness of the first carbon layer that includes graphene is more than 2.5 nm and less than 10 nm.

2. The method of claim 1, further comprising forming, on the first surface of the copper substrate, a passivation layer comprising an alloy film of nickel and chromium (Cr) before forming the preliminary carbon layer.

3. The method of claim 1, wherein the heat treatment is performed under an $N_2$ atmosphere.

4. The method of claim 1, wherein the thickness of the first carbon layer that includes graphene layer is more than 2.5 nm and less than 5 nm.

5. The method of claim 1, wherein the first carbon layer that includes graphene comprises multiple layers of the carbon atoms arranged in a honeycomb structure.

6. The method of claim 1, wherein forming the preliminary carbon layer comprises providing the copper substrate and a carbon ingot into a reaction chamber and applying thermal and/or electrical energy to the carbon ingot.

7. A method of fabricating a high heat radiation thin film including a carbon material, the method comprising:
    preparing a first metal film comprising rolled copper, the first metal film having a first surface and a second surface that is opposite the first surface;
    forming a passivation film on the first surface of the first metal film, the passivation film comprising an alloy film of nickel and chromium (Cr); and
    forming a first carbon layer that includes graphene on the passivation film, wherein forming the first carbon layer comprises providing a preliminary layer of carbon ions onto the first surface of the first metal film having the passivation film formed thereon, and heat-treating the first metal film provided with the preliminary layer of carbon ions in an oxygen-free and hydrogen-free atmosphere at between 600° C. and 800° C.;
    after forming the first carbon layer, forming a second carbon layer on the second surface of the first metal film, wherein the second carbon layer is formed by preparing a carbon coating material comprising graphite powder and a binder, and coating the second surface of the first metal film with the carbon coating material, and wherein the second carbon layer is thicker than the first carbon layer; and
    forming a pressure sensitive adhesion film on the second carbon layer,
    wherein a thickness of the first carbon layer is more than 2.5 nm and less than 10 nm, and
    wherein a thermal conductivity of the first carbon layer is greater than 409 W/mK, and is also greater than a thermal conductivity of the preliminary layer of carbon ions.

8. The method of claim 7, further comprising bonding a second metal film onto the first carbon layer.

9. The method of claim 7, wherein the first metal film is heat-treated under an $N_2$ atmosphere.

10. The method of claim 7, wherein the first carbon layer comprises multiple layers of carbon atoms arranged in a honeycomb structure.

11. The method of claim 7, wherein:
    the first carbon layer has a thickness that is more than 2.5 nm and less than 5 nm.

12. The method of claim 7, wherein forming the first carbon layer comprises providing the first metal film and a carbon ingot into a reaction chamber and applying thermal and/or electrical energy to the carbon ingot.

13. A high heat radiation thin film including a carbon material, the high heat radiation thin film comprising:
    a first metal film comprising rolled copper, the first metal film having a first surface and a second surface that is opposite the first surface;
    a passivation film on the first surface of the first metal film, the passivation film comprising an alloy film of nickel and chromium (Cr);
    a first carbon layer formed on the passivation film, wherein the first carbon layer includes multiple layers of carbon atoms arranged in a honeycomb structure that collectively form a graphitic carbon layer having (i) a thickness that is more than 2.5 nm and less than 10 nm, and (ii) a thermal conductivity that is greater than or equal to 409 W/mK;
    a second carbon layer formed on the second surface of the first metal film, the second carbon layer comprising graphite powder and a binder, wherein the second carbon layer is thicker than the first carbon layer; and
    a pressure sensitive adhesion film formed on the second carbon layer.

14. The high heat radiation thin film of claim 13, further comprising a second metal film bonded onto the pressure sensitive adhesion film.

\* \* \* \* \*